(12) United States Patent
Lin et al.

(10) Patent No.: US 12,184,257 B2
(45) Date of Patent: Dec. 31, 2024

(54) HYBRID SIGNAL FILTER

(71) Applicant: TAI-SAW Technology Co., Ltd., Taoyuan (TW)

(72) Inventors: Shih-Meng Lin, Taoyuan (TW); Fu-Kuo Yu, Taoyuan (TW); Chih-Chung Hsiao, Taoyuan (TW)

(73) Assignee: TAI-SAW Technology Co., Ltd., Taoyuan (TW)

( * ) Notice: Subject to any disclaimer, the term of this patent is extended or adjusted under 35 U.S.C. 154(b) by 368 days.

(21) Appl. No.: 17/689,256

(22) Filed: Mar. 8, 2022

(65) Prior Publication Data

US 2022/0294413 A1 Sep. 15, 2022

(30) Foreign Application Priority Data

Mar. 10, 2021 (TW) .................................. 110108582

(51) Int. Cl.
| | |
|---|---|
| *H03H 7/00* | (2006.01) |
| *H03H 7/075* | (2006.01) |
| *H03H 7/38* | (2006.01) |
| *H03H 9/64* | (2006.01) |
| *H03H 7/01* | (2006.01) |

(52) U.S. Cl.
CPC .............. *H03H 7/075* (2013.01); *H03H 7/38* (2013.01); *H03H 9/6409* (2013.01); *H03H 9/6483* (2013.01); *H03H 2007/013* (2013.01)

(58) Field of Classification Search
CPC ............ H03H 7/00; H03H 7/38; H03H 7/075; H03H 7/0138; H03H 9/46; H03H 9/6406; H03H 9/6409; H03H 9/6483

USPC .................................................. 333/172–175
See application file for complete search history.

(56) References Cited

U.S. PATENT DOCUMENTS 10,848,126 B2 * 11/2020 Alicioglu ............. H03H 9/6409
2014/0035702 A1    2/2014  Black

FOREIGN PATENT DOCUMENTS

| TW | 200826625 A | 6/2008 |
|---|---|---|
| TW | M445817 U | 1/2013 |
| WO | 2006/032366 A1 | 3/2006 |
| WO | 2019/132937 A1 | 7/2019 |

* cited by examiner

*Primary Examiner* — Hai L Nguyen
(74) *Attorney, Agent, or Firm* — Volpe Koenig

(57) ABSTRACT

A signal filter includes a notch filter and a wideband filter. The notch filter is configured to perform a band-rejection filtering operation according to a band-rejection filtering property. The wideband filter is coupled to the notch filter, and is configured to perform a wideband filtering operation according to a wideband filtering property. The band-rejection filtering property includes a first cutoff frequency, a frequency bandwidth, a relatively high quality factor and a relatively low coupling coefficient. The wideband filtering property includes a second cutoff frequency, a relatively low quality factor and a relatively high coupling coefficient. The first and the second cutoff frequencies have a frequency difference therebetween. A ratio of the frequency difference to the frequency bandwidth is within a preset ratio range being from 2.5% to 20%.

20 Claims, 22 Drawing Sheets

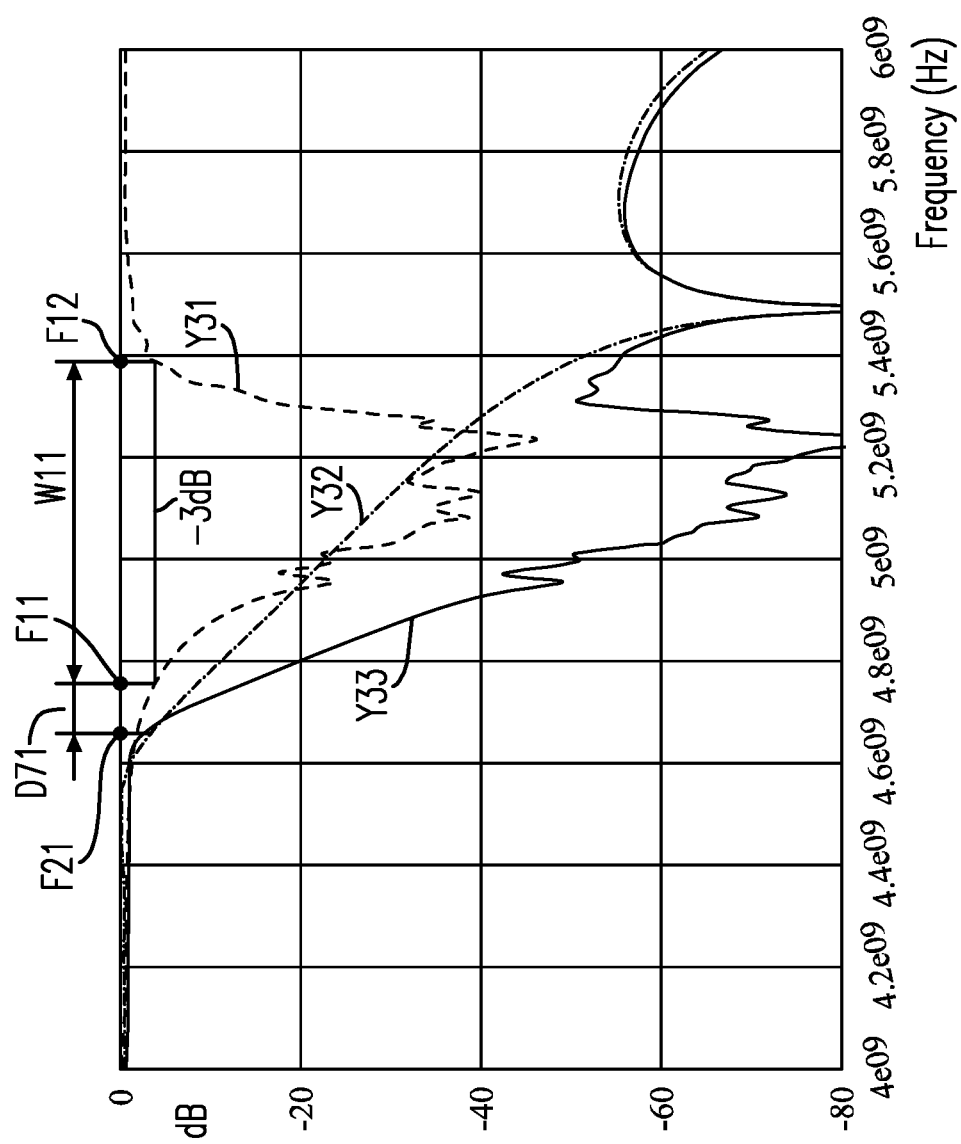

HYBRID SIGNAL FILTER

CROSS-REFERENCE TO RELATED APPLICATION AND CLAIM OF PRIORITY

The application claims the benefit of Taiwan Patent Application No. 110108582, filed on Mar. 10, 2021, at the Taiwan Intellectual Property Office, the disclosures of which are incorporated herein in their entirety by reference.

TECHNICAL FIELD

The present disclosure is related to a signal filter and, more particularly, is related to a hybrid signal filter.

BACKGROUND

The Surface-Acoustic-Wave (SAW) technology has many different applications in radio electronics and a Radio Frequency (RF) field. A SAW resonator using the SAW technology can be applied to a signal filtering operation. The SAW resonator includes a piezoelectric substrate, an interdigital transducer, a first reflector and a second reflector being opposite to the first reflector. Each of the interdigital transducer, the first reflector and the second reflector is disposed on the piezoelectric substrate.

An inductor-capacitor resonator can provide a wideband having a low insertion loss, but has a limited roll-off and selectivity. In order to cause a microwave filter to have a good selectivity and wideband, there is a demand to improve a present signal filter.

SUMMARY OF EXEMPLARY EMBODIMENTS

It is one aspect of the present disclosure to provide a signal filter having a notch filter and a wideband filter, wherein the notch filter and the wideband filter have a specific filtering property therebetween to cause the signal filter to easily meet a specific filter specification.

It is therefore one embodiment of the present disclosure to provide a signal filter. The signal filter includes an integrated multilayer substrate, a notch filter and a wideband filter. The integrated multilayer substrate includes a coupling circuit. The notch filter is disposed on the integrated multilayer substrate, is configured to meet a band-rejection filtering property, and performs a band-rejection filtering operation according to the band-rejection filtering property. The wideband filter is disposed in the integrated multilayer substrate, is configured to meet a wideband filtering property, and performs a wideband filtering operation according to the wideband filtering property. The notch filter is electrically coupled to the wideband filter through the coupling circuit. The band-rejection filtering property includes a first cutoff frequency, a first frequency bandwidth, a relatively high quality factor and a relatively low coupling coefficient. The wideband filtering property includes a second cutoff frequency, a relatively low quality factor and a relatively high coupling coefficient. The first and the second cutoff frequencies have a frequency difference therebetween. A ratio of the frequency difference to the frequency bandwidth is within a preset ratio range being from 2.5% to 20%.

It is therefore one embodiment of the present disclosure to provide a signal filter. The signal filter includes a notch filter, a wideband filter and a printed circuit board. The notch filter is configured to meet a band-rejection filtering property, and performs a band-rejection filtering operation according to the band-rejection filtering property. The wideband filter is configured to meet a wideband filtering property, and performs a wideband filtering operation according to the wideband filtering property. The printed circuit board is configured to support the notch filter and the wideband filter, and includes a printed circuit. The notch filter is electrically coupled to the wideband filter through the printed circuit. The band-rejection filtering property includes a first cutoff frequency, a first frequency bandwidth, a relatively high quality factor and a relatively low coupling coefficient. The wideband filtering property includes a second cutoff frequency, a relatively low quality factor and a relatively high coupling coefficient. The first and the second cutoff frequencies have a frequency difference therebetween. A ratio of the frequency difference to the frequency bandwidth is within a preset ratio range being from 2.5% to 20%.

It is therefore one embodiment of the present disclosure to provide a signal filter. The signal filter includes a notch filter, a wideband filter and a substrate. The notch filter is configured to perform a band-rejection filtering operation according to a band-rejection filtering property. The wideband filter is configured to perform a wideband filtering operation according to a wideband filtering property. The substrate supports the notch filter and the wideband filter, and includes a coupling circuit. The notch filter is electrically coupled to the wideband filter through the coupling circuit. The band-rejection filtering property includes a first cutoff frequency, a first frequency bandwidth, a relatively high quality factor and a relatively low coupling coefficient. The wideband filtering property includes a second cutoff frequency, a relatively low quality factor and a relatively high coupling coefficient. The first and the second cutoff frequencies have a frequency difference therebetween. A ratio of the frequency difference to the frequency bandwidth is within a preset ratio range being from 2.5% to 20%.

It is therefore one embodiment of the present disclosure to provide a signal filter. The signal filter includes a first filtering unit, a second filtering unit and a substrate. The first filtering unit is configured to perform a first specific filtering operation according to a first specific filtering property including a relatively high quality factor and a relatively low coupling coefficient. The second filtering unit is configured to perform a second specific filtering operation according to a second specific filtering property including a relatively low quality factor and a relatively high coupling coefficient. The substrate supports the first and the second filtering units, and includes a coupling circuit, wherein the first filtering unit is electrically coupled to the second filtering unit through the coupling circuit.

It is therefore one embodiment of the present disclosure to provide a signal filter. The signal filter includes a notch filter and a wideband filter. The notch filter is configured to perform a band-rejection filtering operation according to a band-rejection filtering property. The wideband filter is coupled to the notch filter, and is configured to perform a wideband filtering operation according to a wideband filtering property. The band-rejection filtering property includes a first cutoff frequency, a frequency bandwidth, a relatively high quality factor and a relatively low coupling coefficient. The wideband filtering property includes a second cutoff frequency, a relatively low quality factor and a relatively high coupling coefficient. The first and the second cutoff frequencies have a frequency difference therebetween. A ratio of the frequency difference to the frequency bandwidth is within a preset ratio range being from 2.5% to 20%.

BRIEF DESCRIPTION OF THE DRAWINGS

The foregoing and other features and advantages of the present disclosure will be more clearly understood through the following descriptions with reference to the drawings, wherein:

FIG. 22 is a schematic diagram showing a specific filtering property of the filtering output property, shown in FIG. 21, within a specific frequency range.

DETAILED DESCRIPTION OF THE PREFERRED EMBODIMENTS

The present disclosure will now be described more specifically with reference to the following embodiments. It is to be noted that the following descriptions of preferred embodiments of this disclosure are presented herein for the purposes of illustration and description only; they are not intended to be exhaustive or to be limited to the precise form disclosed.

Figure 1:
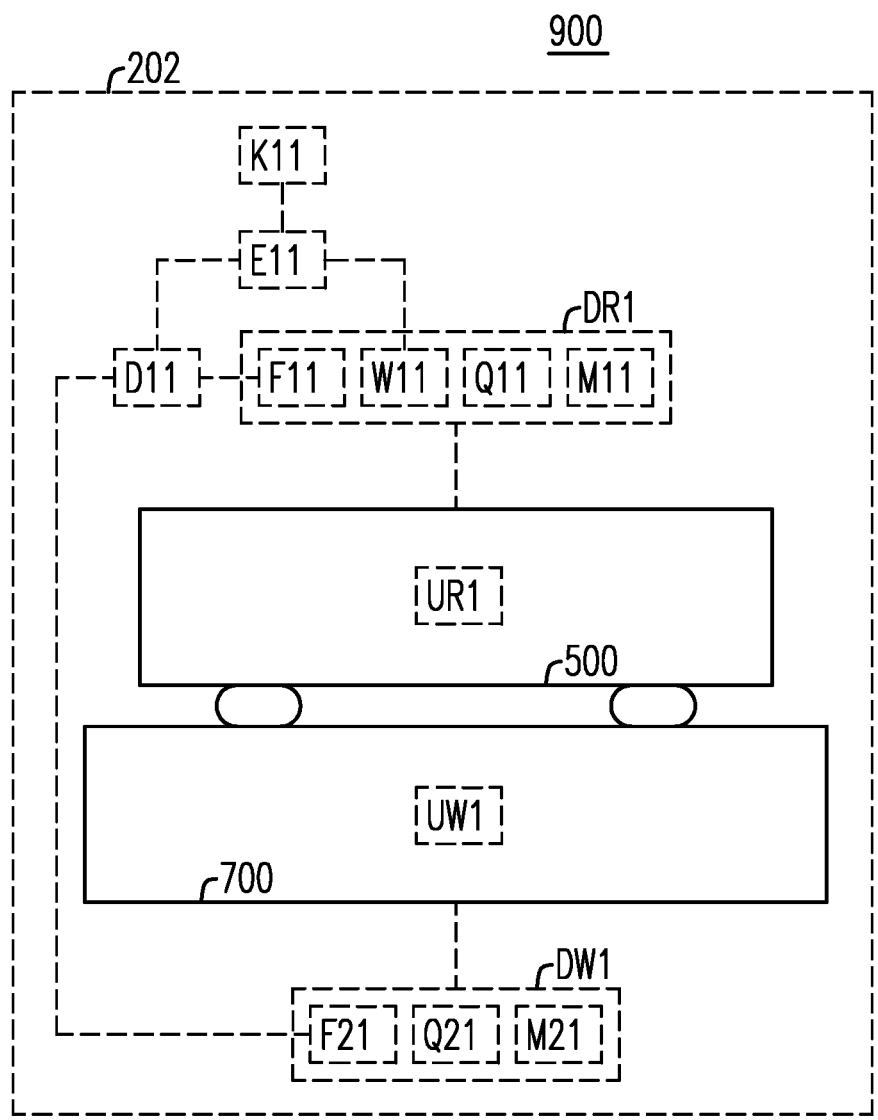
FIG. 1 is a schematic diagram showing a signal processing system according to various embodiments of the present disclosure.

Please refer to FIG. 1, which is a schematic diagram showing a signal processing system 900 according to various embodiments of the present disclosure. As shown in FIG. 1, the signal processing system 900 includes a signal filter 202. The signal filter 202 includes a notch filter 500 and a wideband filter 700. The notch filter 500 is configured to meet a band-rejection filtering property DR1, and performs a band-rejection filtering operation UR1 according to the band-rejection filtering property DR1. The wideband filter 700 is coupled to the notch filter 500, is configured to meet a wideband filtering property DW1, and performs a wideband filtering operation UW1 according to the wideband filtering property DW1.

For example, the band-rejection filtering property DR1 includes a first cutoff frequency F11, a frequency bandwidth W11, a relatively high quality factor Q11 and a relatively low coupling coefficient M11. The wideband filtering property DW1 includes a second cutoff frequency F21, a relatively low quality factor Q21 and a relatively high coupling coefficient M21. The first and the second cutoff frequencies F11 and F21 have a frequency difference D11 therebetween. A ratio E11 of the frequency difference D11 to the frequency bandwidth W11 is within a preset ratio range K11, wherein the preset ratio range K11 is from 2.5% (i.e. 2.5 percent) to 20% (i.e. 20 percent).

Figure 2:
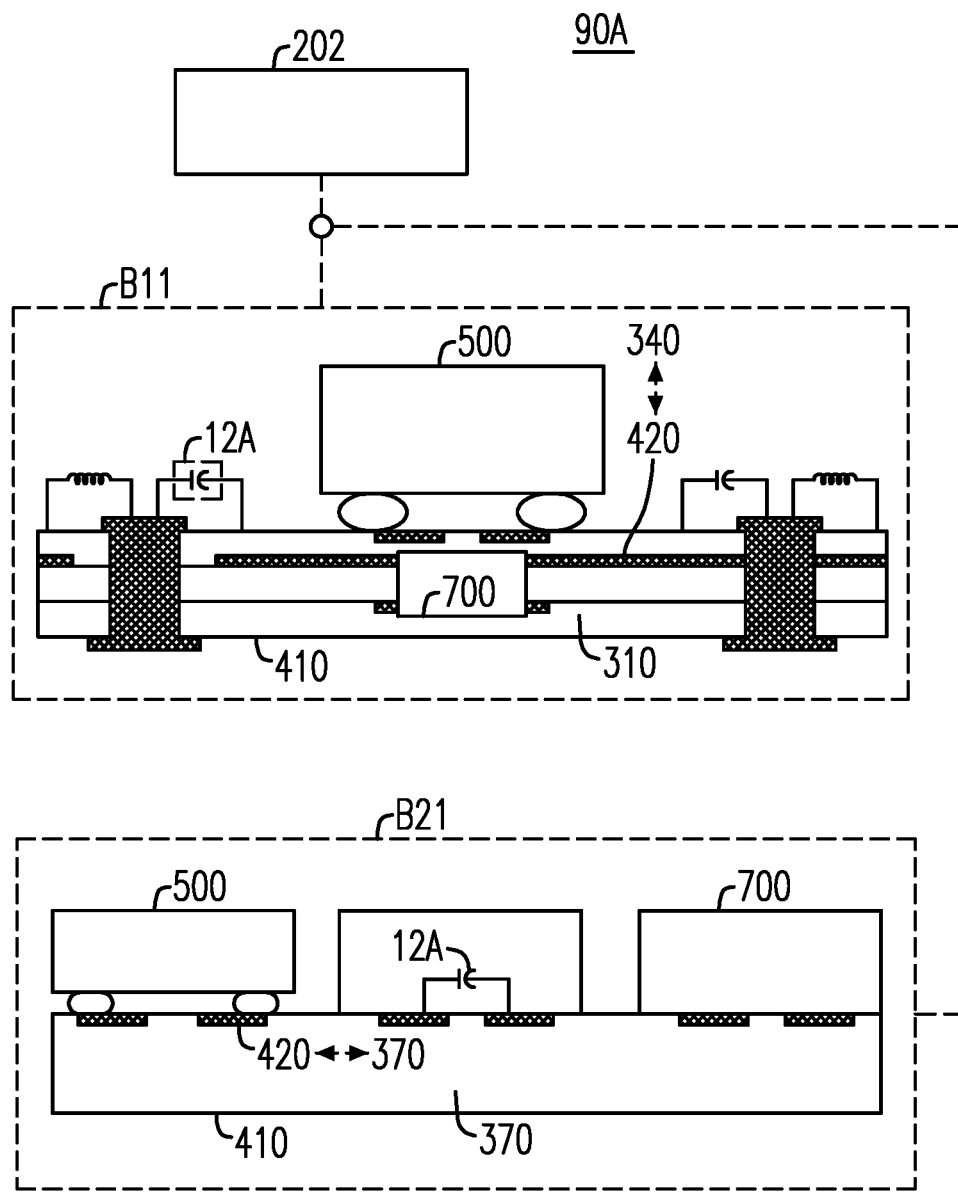
FIG. 2 is a schematic diagram showing an implementation structure of the signal processing system shown in FIG. 1.

Please refer to FIG. 2, which is a schematic diagram showing an implementation structure 90A of the signal processing system 900 shown in FIG. 1. As shown in FIG. 2, the implementation structure 90A includes the signal filter 202. The signal filter 202 is a hybrid signal filter, and further includes a coupling substrate 410 and an impedance matching element 12A. In some embodiments, the coupling substrate 410 supports the notch filter 500, the wideband filter 700 and the impedance matching element 12A, and includes a coupling circuit 420. The notch filter 500 is electrically coupled to the wideband filter 700 through the coupling circuit 420. The impedance matching element 12A is electrically coupled to the notch filter 500 and the wideband filter 700 through the coupling circuit 420. The signal filter 202 is in one of a first structure state B11 and a second structure state B21.

For example, under a condition that the signal filter 202 is in the first structure state B11: the coupling substrate 410 is an integrated multilayer substrate 310; the coupling circuit 420 is a structure circuit 340; each of the impedance matching element 12A and the notch filter 500 is disposed on the integrated multilayer substrate 310; and the wideband filter 700 is disposed in the integrated multilayer substrate 310. Under a condition that the signal filter 202 is in the second structure state B21: the coupling substrate 410 is a printed circuit board 360; the coupling circuit 420 is a printed circuit 370; and each of the impedance matching element 12A, the notch filter 500 and the wideband filter 700 is disposed on the printed circuit board 360. For example, the relatively high quality factor Q11 is greater than the relatively low quality factor Q21. The relatively high coupling coefficient M21 is greater than the relatively low coupling coefficient M11. For example, the notch filter 500 is configured to perform the band-rejection filtering operation UR1 according to the band-rejection filtering property DR1. The wideband filter 700 is buried in the integrated multilayer substrate 310, and is configured to perform the wideband filtering operation UW1 according to the wideband filtering property DW1. The coupling substrate 410 is a substrate.

Figure 3:
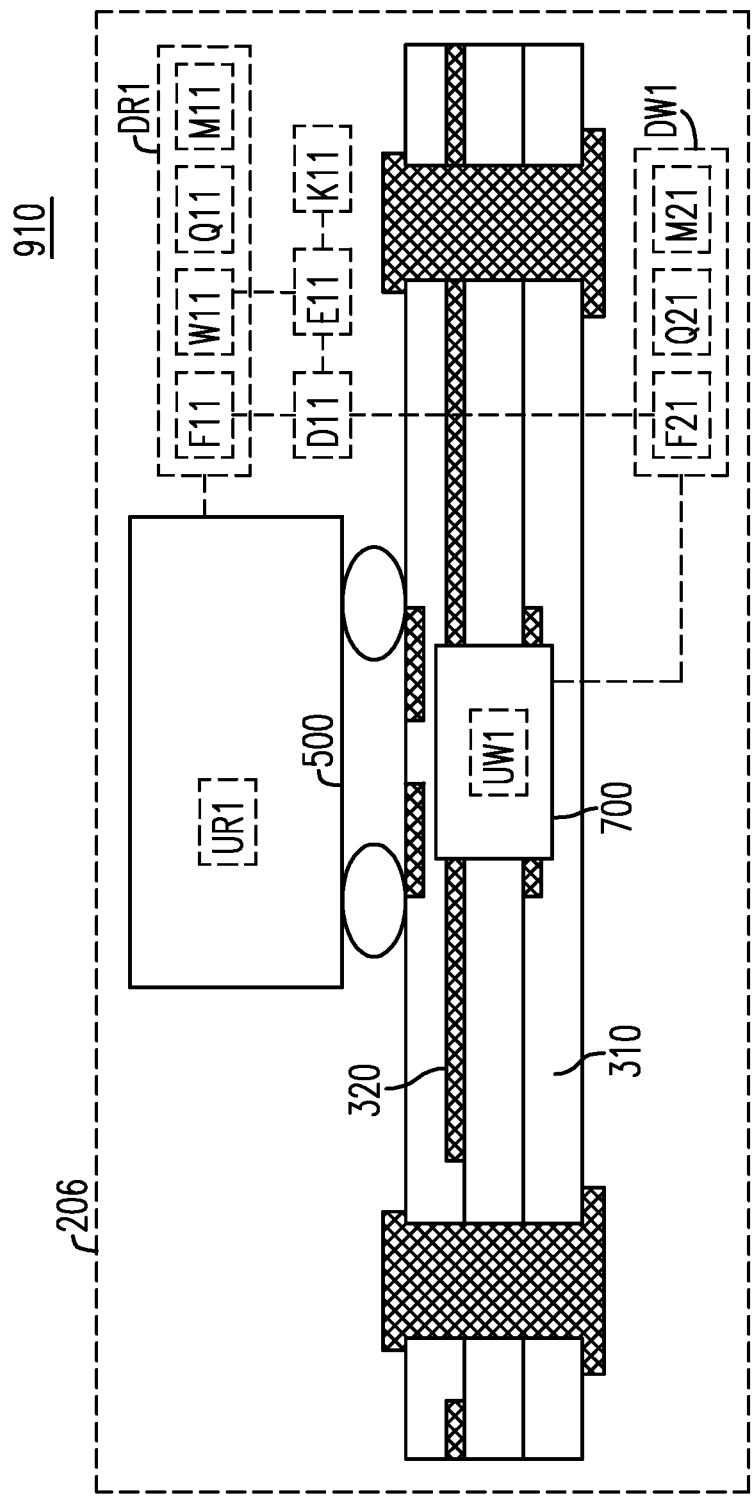
FIG. 3 is a schematic diagram showing a signal processing system according to various embodiments of the present disclosure.

Please refer to FIG. 3, which is a schematic diagram showing a signal processing system 910 according to various embodiments of the present disclosure. As shown in FIG. 3, the signal processing system 910 includes a signal filter 206. The signal filter 206 includes an integrated multilayer substrate 310, a notch filter 500 and a wideband filter 700. The integrated multilayer substrate 310 includes a coupling circuit 320. The notch filter 500 is disposed on the integrated multilayer substrate 310, is configured to meet a band-rejection filtering property DR1, and performs a band-rejection filtering operation UR1 according to the band-rejection filtering property DR1. The wideband filter 700 is disposed in the integrated multilayer substrate 310, is configured to meet a wideband filtering property DW1, and performs a wideband filtering operation UW1 according to the wideband filtering property DW1.

For example, the notch filter 500 is electrically coupled to the wideband filter 700 through the coupling circuit 320. The band-rejection filtering property DR1 includes a first cutoff frequency F11, a first frequency bandwidth W11, a relatively high quality factor Q11 and a relatively low coupling coefficient M11. The wideband filtering property DW1 includes a second cutoff frequency F21, a relatively low quality factor Q21 and a relatively high coupling coefficient M21. The first and the second cutoff frequencies F11 and F21 have a frequency difference D11 therebetween. A ratio E11 of the frequency difference D11 to the first frequency bandwidth W11 is within a preset ratio range K11. For example, the preset ratio range K11 is from 2.5% (i.e. 2.5 percent) to 20% (i.e. 20 percent).

Figure 4:
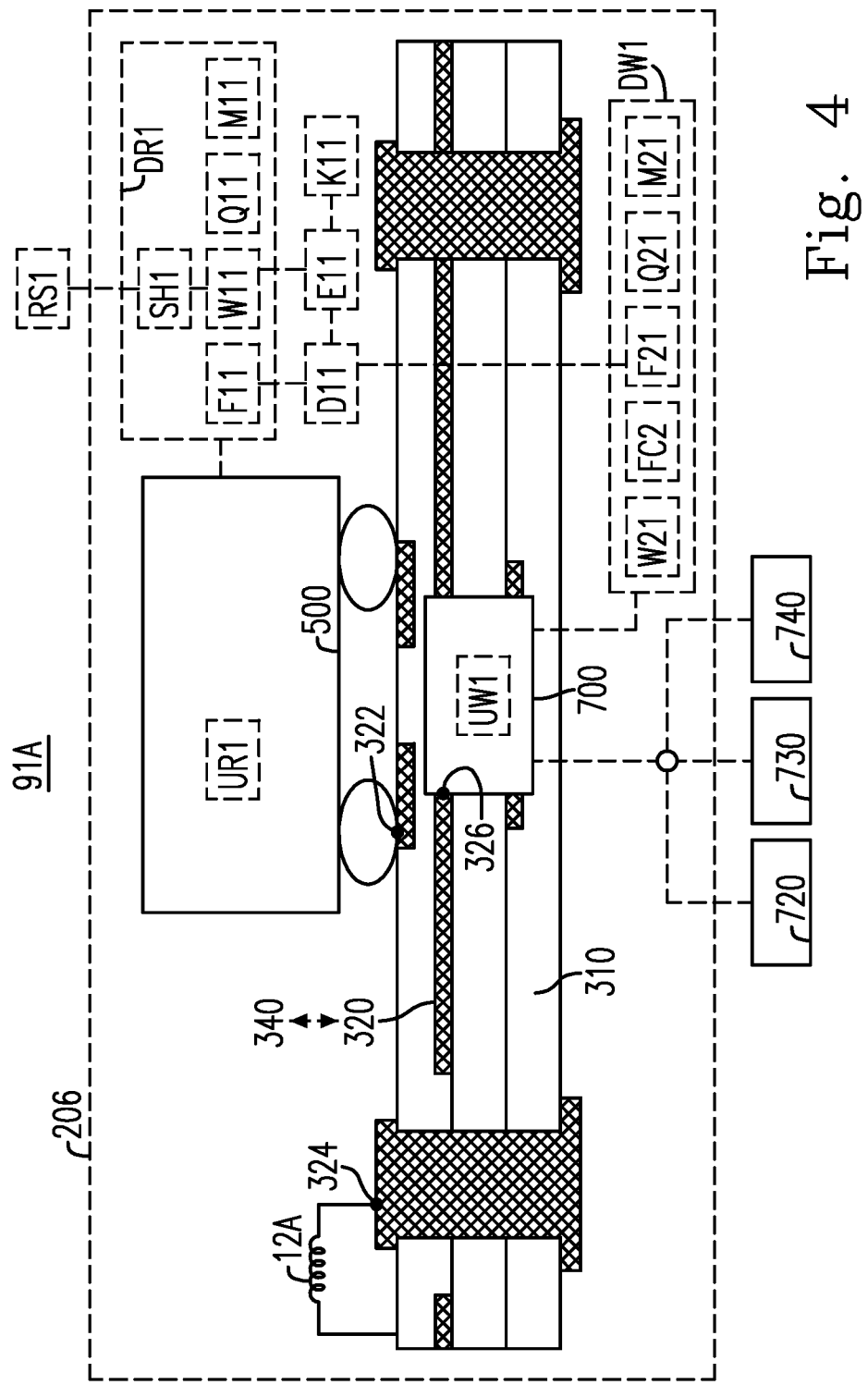
FIG. 4 is a schematic diagram showing an implementation structure of the signal processing system shown in FIG. 3.

Please refer to FIG. 4, which is a schematic diagram showing an implementation structure 91A of the signal processing system 910 shown in FIG. 3. As shown in FIG. 4, the implementation structure 91A includes the signal filter 206. The signal filter 206 further includes an impedance matching element 12A. In some embodiments, the coupling circuit 320 includes a first outer connection terminal 322, a second outer connection terminal 324 and an inner connection terminal 326. For example, the coupling circuit 320 is a structure circuit 340. The impedance matching element 12A is one of a capacitor and an inductor.

The notch filter 500 and the impedance matching element 12A are electrically connected to the first and the second outer connection terminals 322 and 324 respectively. The wideband filter 700 is electrically connected to the inner connection terminal 326. The impedance matching element 12A is electrically coupled to the notch filter 500 and the wideband filter 700 through the coupling circuit 320. The relatively high quality factor Q11 ranges from 950 to 3500. A shape factor SH1 associated with the first frequency bandwidth W11 is within a preset shape factor range RS1. For example, the preset shape factor range RS1 is from 0.4 to 0.8. For example, the band-rejection filtering property DR1 further includes the shape factor SH1. The shape factor SH1 is a specific factor of −20 dB/−3 dB (or 20 dB attenuation to 3 dB attenuation).

The wideband filter 700 is one selected from a group consisting of a high-pass filter 720, a band-pass filter 730 and a low-pass filter 740. Under a condition that the wideband filter 700 is the band-pass filter 730, the wideband filtering property DW1 further includes a second frequency bandwidth W21 and a center frequency FC2. A ratio of the second frequency bandwidth W21 to the center frequency FC2 ranges from 5% to 50%. The wideband filter 700 is manufactured by using one of a multilayer ceramic capacitor (MLCC) process and a low-temperature co-fired ceramic (LTCC) process in order to meet the wideband filtering property DW1. A coupling ratio associated with the relatively high coupling coefficient M21 ranges from 30% to 60%.

Figure 5:
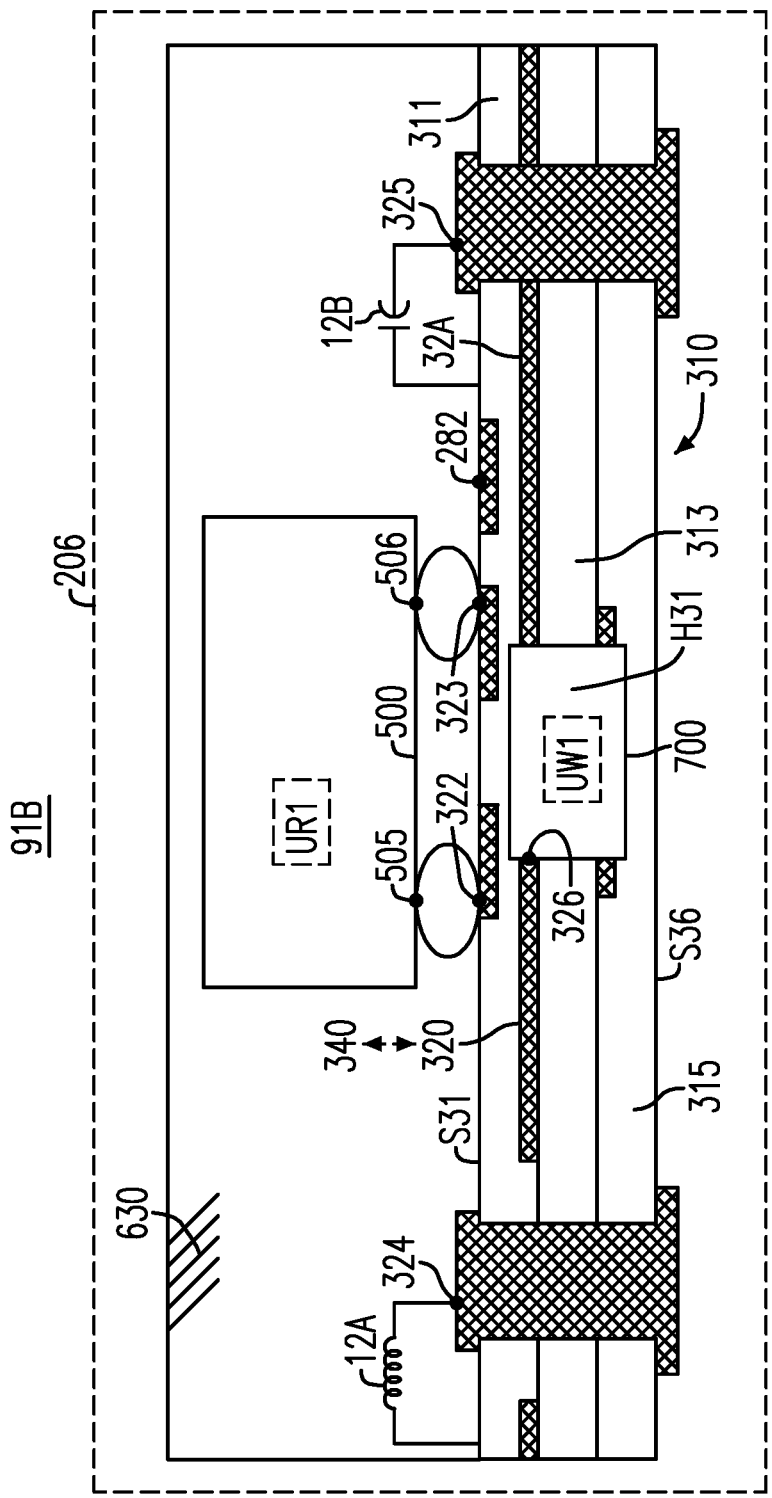
FIG. 5 is a schematic diagram showing an implementation structure of the signal processing system shown in FIG. 3.

Please refer to FIG. 5, which is a schematic diagram showing an implementation structure 91B of the signal processing system 910 shown in FIG. 3. As shown in FIG. 5, the implementation structure 91B includes the signal filter 206. The signal filter 206 includes the integrated multilayer substrate 310, the notch filter 500 and the wideband filter 700. The integrated multilayer substrate 310 includes a top-layer insulation substrate 311, a bottom-layer insulation substrate 315, and an intermediate-layer insulation substrate 313 disposed between the top-layer and bottom-layer insulation substrates 311 and 315. The top-layer insulation substrate 311 has a top surface S31. Each of the first and the second outer connection terminals 322 and 324 is at least partly disposed on the top surface S31.

The bottom-layer insulation substrate 315 has a bottom surface S36. The intermediate-layer insulation substrate 313 has a spatial hole H31. The wideband filter 700 is disposed between the top and the bottom surfaces S31 and S36 through the spatial hole H31. The coupling circuit 320 further includes an outer connection terminal 323 matching the first outer connection terminal 322. The first outer connection terminal 322 and the outer connection terminal 323 are two bonding pads respectively. The notch filter 500 includes a connection terminal 505 and a connection terminal 506 being opposite to the connection terminal 505. The connection terminals 505 and 506 are electrically connected to the first outer connection terminal 322 and the outer connection terminal 323 respectively.

For example, the connection terminals 505 and 506 are electrically connected to the first outer connection terminal 322 and the outer connection terminal 323 by using a first flip-chip connection and a second flip-chip connection respectively. The coupling circuit 320 further includes an outer connection terminal 325 associated with the second outer connection terminal 324. The signal filter 206 further includes an impedance matching element 12B electrically connected to the second outer connection terminal 324, and a protection layer 630 disposed on the top surface S31. The protection layer 630 covers the notch filter 500 and the impedance matching elements 12A and 12B. For example, the impedance matching element 12B is one of a capacitor and an inductor.

The coupling circuit 320 includes an inner circuit portion 32A disposed in the integrated multilayer substrate 310. The wideband filter 700 is electrically connected to the impedance matching elements 12A and 12B through the inner circuit portion 32A, and is electrically coupled to the notch filter 500 through the inner circuit portion 32A. For example, the wideband filter 700 is electrically connected to a second port 282 through the inner circuit portion 32A. The second port 282 generates an output signal. For example, the inner circuit portion 32A is buried in the integrated multilayer substrate 310.

Figure 6:
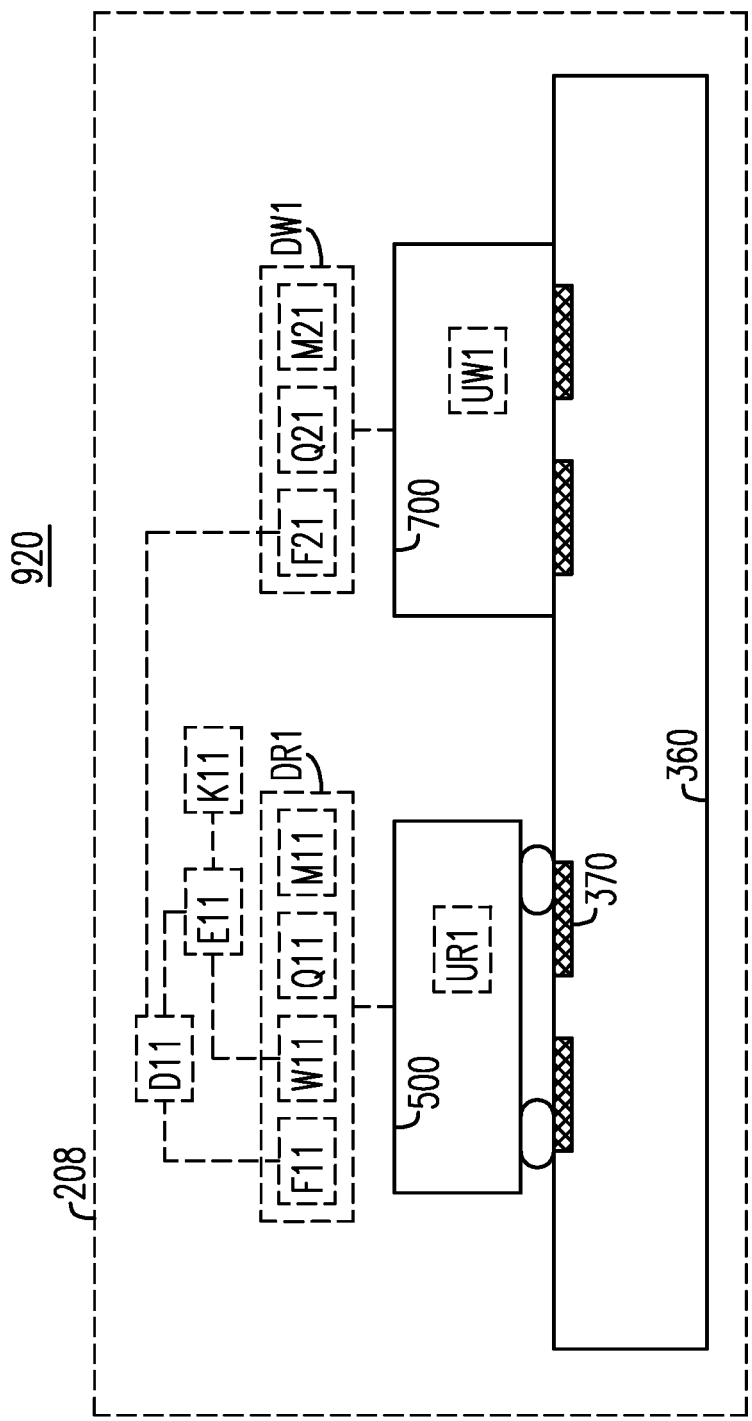
FIG. 6 is a schematic diagram showing a signal processing system according to various embodiments of the present disclosure.

Please refer to FIG. 6, which is a schematic diagram showing a signal processing system 920 according to various embodiments of the present disclosure. As shown in FIG. 6, the signal processing system 920 includes a signal filter 208. The signal filter 208 includes a notch filter 500, a wideband filter 700 and a printed circuit board 360. The notch filter 500 is configured to meet a band-rejection filtering property DR1, and performs a band-rejection filtering operation UR1 according to the band-rejection filtering property DR1. The wideband filter 700 is configured to meet a wideband filtering property DW1, and performs a wideband filtering operation UW1 according to the wideband filtering property DW1. The printed circuit board 360 is configured to support the notch filter 500 and the wideband filter 700, and includes a printed circuit 370.

For example, the notch filter 500 is electrically coupled to the wideband filter 700 through the printed circuit 370. The band-rejection filtering property DR1 includes a first cutoff frequency F11, a first frequency bandwidth W11, a relatively high quality factor Q11 and a relatively low coupling coefficient M11. The wideband filtering property DW1 includes a second cutoff frequency F21, a relatively low quality factor Q21 and a relatively high coupling coefficient M21. The first and the second cutoff frequencies F11 and F21 have a frequency difference D11 therebetween. A ratio E11 of the frequency difference D11 to the first frequency bandwidth W11 is within a preset ratio range K11. For example, the preset ratio range K11 is from 2.5% (i.e. 2.5 percent) to 20% (i.e. 20 percent).

Figure 7:
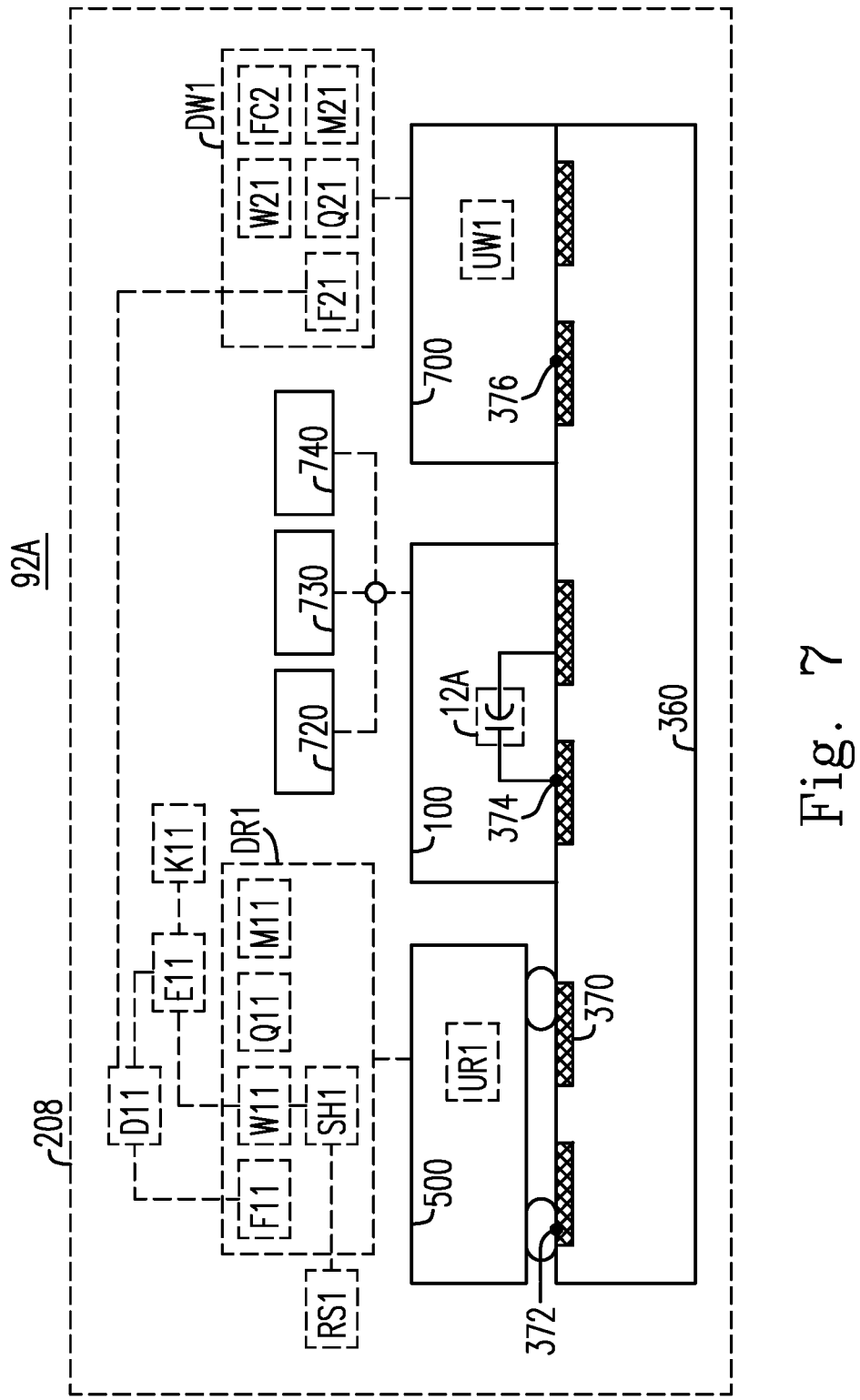
FIG. 7 is a schematic diagram showing an implementation structure of the signal processing system shown in FIG. 6.

Please refer to FIG. 7, which is a schematic diagram showing an implementation structure 92A of the signal processing system 920 shown in FIG. 6. As shown in FIG. 7, the implementation structure 92A includes the signal filter 208. The signal filter 208 further includes an impedance matching unit 100. In some embodiments, the printed circuit 370 includes a first connection terminal 372, a second connection terminal 374 and a third connection terminal 376. The notch filter 500, the impedance matching unit 100 and the wideband filter 700 are electrically connected to the first, the second and the third connection terminals 372, 374 and 376 respectively.

The impedance matching unit 100 includes at least one impedance matching element 12A, and is electrically coupled to the notch filter 500 and the wideband filter 700 through the printed circuit 370. The relatively high quality factor Q11 ranges from 950 to 3500. A shape factor SH1 associated with the first frequency bandwidth W11 is within a preset shape factor range RS1, wherein the preset shape factor range RS1 is from 0.4 to 0.8. For example, the band-rejection filtering property DR1 further includes the shape factor SH1.

The wideband filter 700 is one selected from a group consisting of a high-pass filter 720, a band-pass filter 730 and a low-pass filter 740. Under a condition that the wideband filter 700 is the band-pass filter 730, the wideband filtering property DW1 further includes a second frequency bandwidth W21 and a center frequency FC2. A ratio of the second frequency bandwidth W21 to the center frequency FC2 ranges from 5% to 50%. The wideband filter 700 is manufactured by using one of a multilayer ceramic capacitor (MLCC) process and a low-temperature co-fired ceramic (LTCC) process in order to meet the wideband filtering property DW1. A coupling ratio associated with the relatively high coupling coefficient M21 ranges from 30% to 60%.

Figure 8:
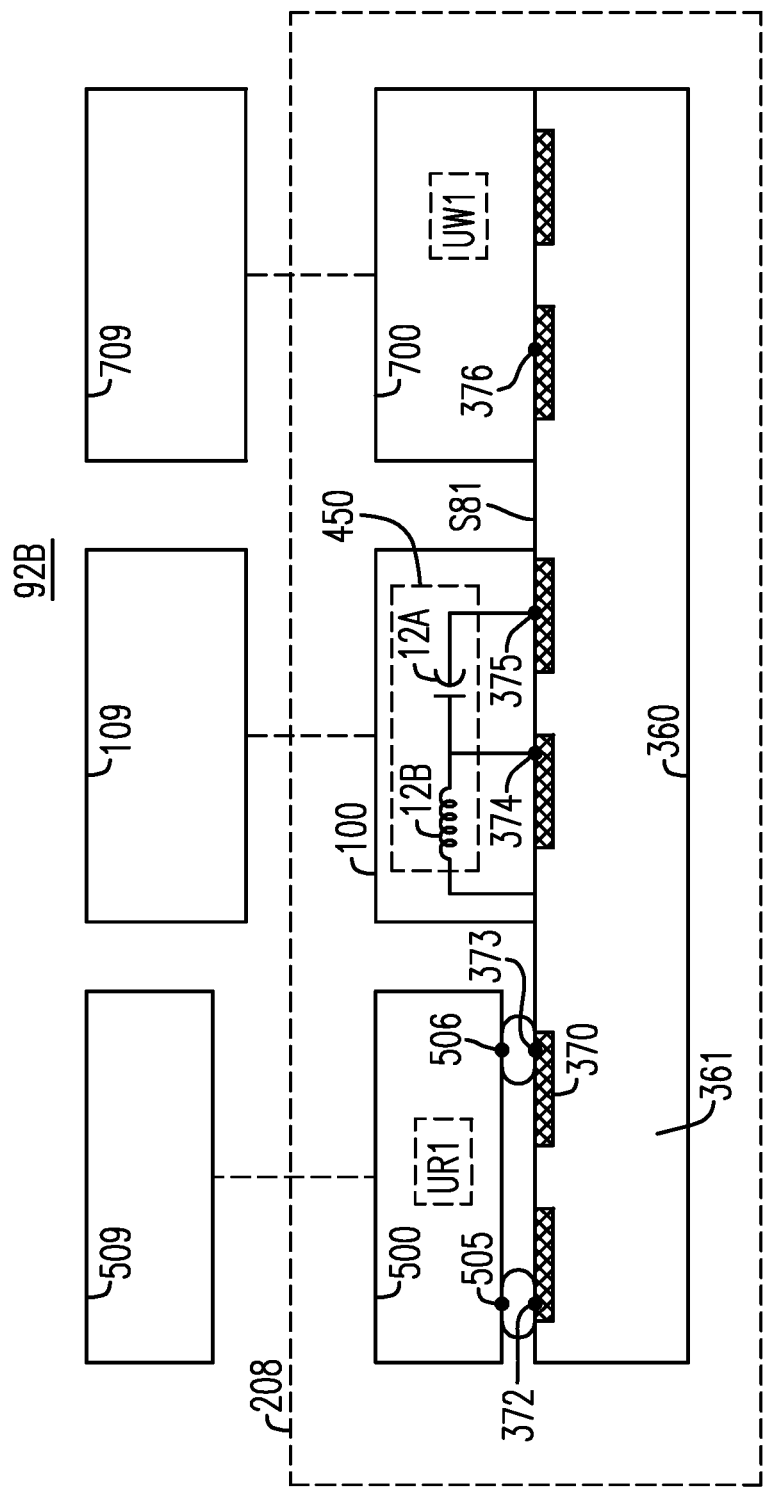
FIG. 8 is a schematic diagram showing a front view of an implementation structure of the signal filter shown in FIG. 6.
Figure 9:
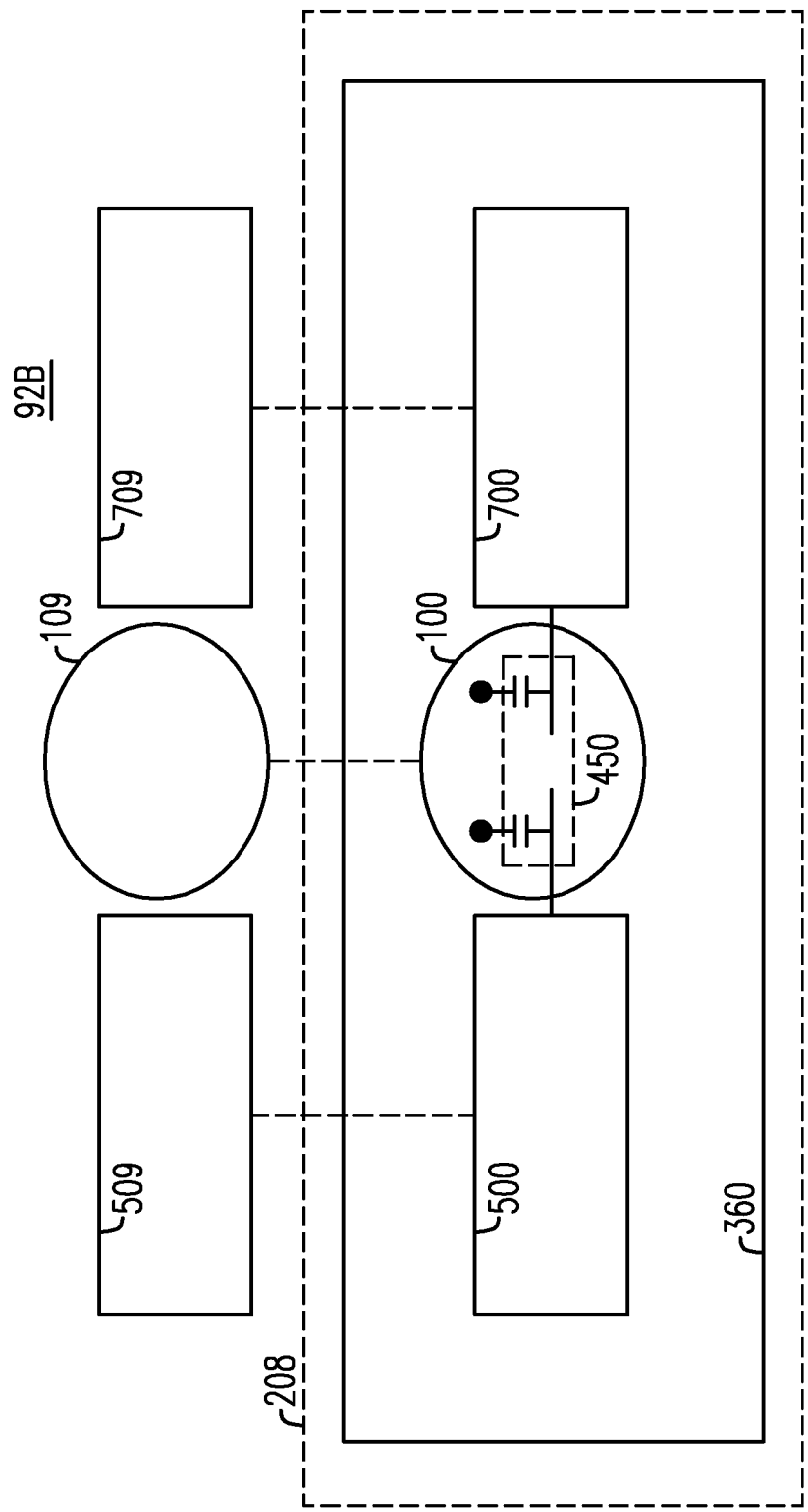
FIG. 9 is a schematic diagram showing a top view of the implementation structure shown in FIG. 8.

Please refer to FIG. 8 and FIG. 9. FIG. 8 is a schematic diagram showing a front view of an implementation structure 92B of the signal filter 208 shown in FIG. 6. FIG. 9 is a schematic diagram showing a top view of the implementation structure 92B shown in FIG. 8. As shown in FIGS. 8 and 9, the implementation structure 92B includes the notch filter 500, the wideband filter 700 and the printed circuit board 360. The printed circuit board 360 includes an insulation substrate 361 and the printed circuit 370 disposed on the insulation substrate 361. For example, the insulation substrate 361 has a top surface S81. The printed circuit 37 is disposed on the top surface S81.

The printed circuit 370 further includes a connection terminal 373 matching the first connection terminal 372. The first connection terminal 372 and the connection terminal 373 are two bonding pads respectively. The notch filter 500 includes a connection terminal 505 and a connection terminal 506 being opposite to the connection terminal 505. The connection terminals 505 and 506 are electrically connected to the first connection terminal 372 and the connection terminal 373 respectively. For example, the connection terminals 505 and 506 are electrically connected to the first connection terminal 372 and the connection terminal 373 by using a first flip-chip connection and a second flip-chip connection respectively. The impedance matching unit 100 includes a matching network 450. The matching network 450 is an impedance matching circuit, and includes the impedance matching element 12A and an impedance matching element 12B electrically connected to the impedance matching element 12A. The notch filter 500 is coupled to the wideband filter 700 through the matching network 450.

In some embodiments, because the printed circuit board 360 is used to install the notch filter 500, the wideband filter 700 and the impedance matching unit 100, at least one selected from a group consisting of the notch filter 500, the wideband filter 700 and the impedance matching unit 100 can be replaced to adjust a product feature of the signal filter 208. For example, the notch filter 500 is replaced with a notch filter 509 being different from the notch filter 500. The wideband filter 700 is replaced with a wideband filter 709 being different from the wideband filter 700. The impedance matching unit 100 is replaced with an impedance matching unit 109 being different from the impedance matching unit 100. For example, the impedance matching elements 12A and 12B are a capacitor and an inductor respectively.

Figure 10:
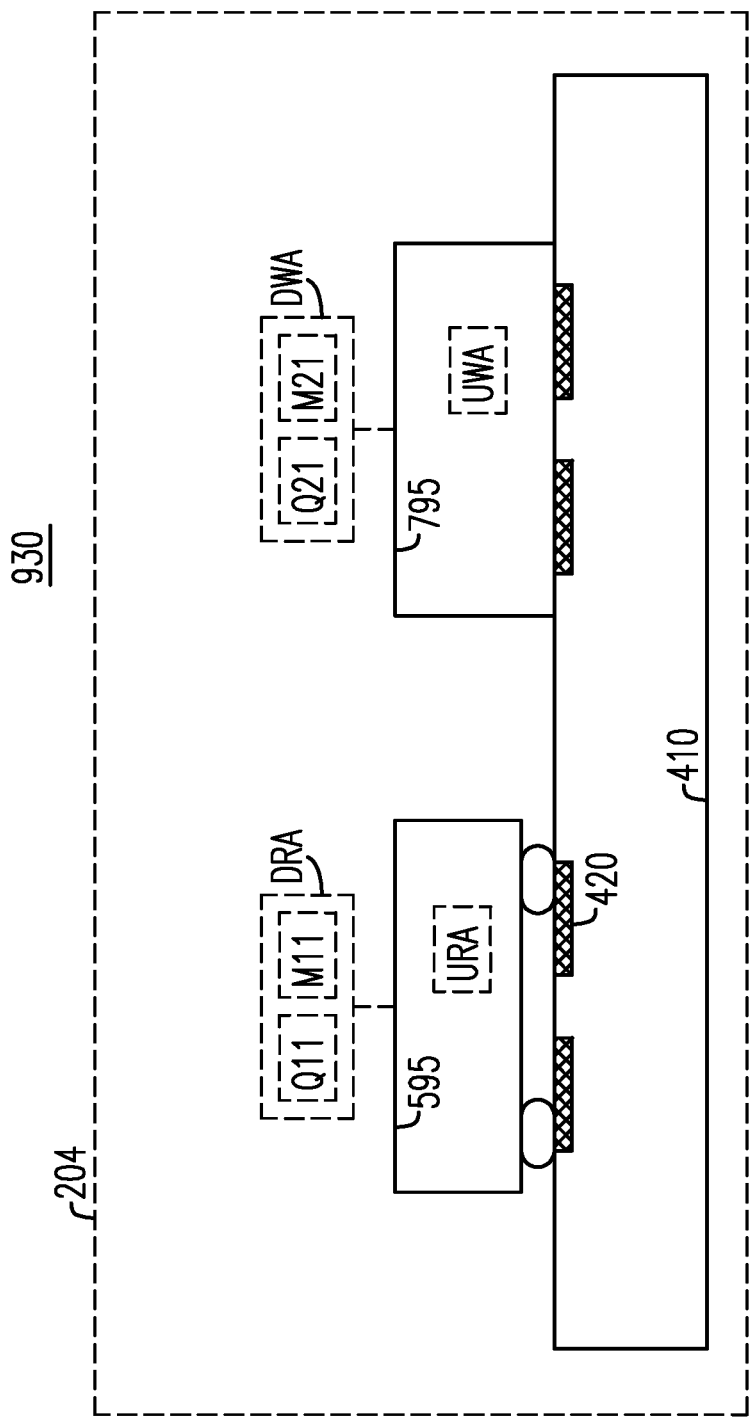
FIG. 10 is a schematic diagram showing a signal processing system according to various embodiments of the present disclosure.

Please refer to FIG. 10, which is a schematic diagram showing a signal processing system 930 according to various embodiments of the present disclosure. As shown in FIG. 10, the signal processing system 930 includes a signal filter 204. The signal filter 204 includes a first filtering unit 595, a second filtering unit 795 and a coupling substrate 410. The first filtering unit 595 is configured to meet a first specific filtering property DRA, and performs a first specific filtering operation URA according to the first specific filtering property DRA. For example, the first specific filtering property DRA includes a relatively high quality factor Q11 and a relatively low coupling coefficient M11.

The second filtering unit 795 is configured to meet a second specific filtering property DWA, and performs a second specific filtering operation UWA according to the second specific filtering property DWA. For example, the second specific filtering property DWA includes a relatively low quality factor Q21 and a relatively high coupling coefficient M21. The coupling substrate 410 supports the first and the second filtering units 595 and 795, and includes a coupling circuit 420. For example, the first filtering unit 595 is electrically coupled to the second filtering unit 795 through the coupling circuit 420.

Figure 11:
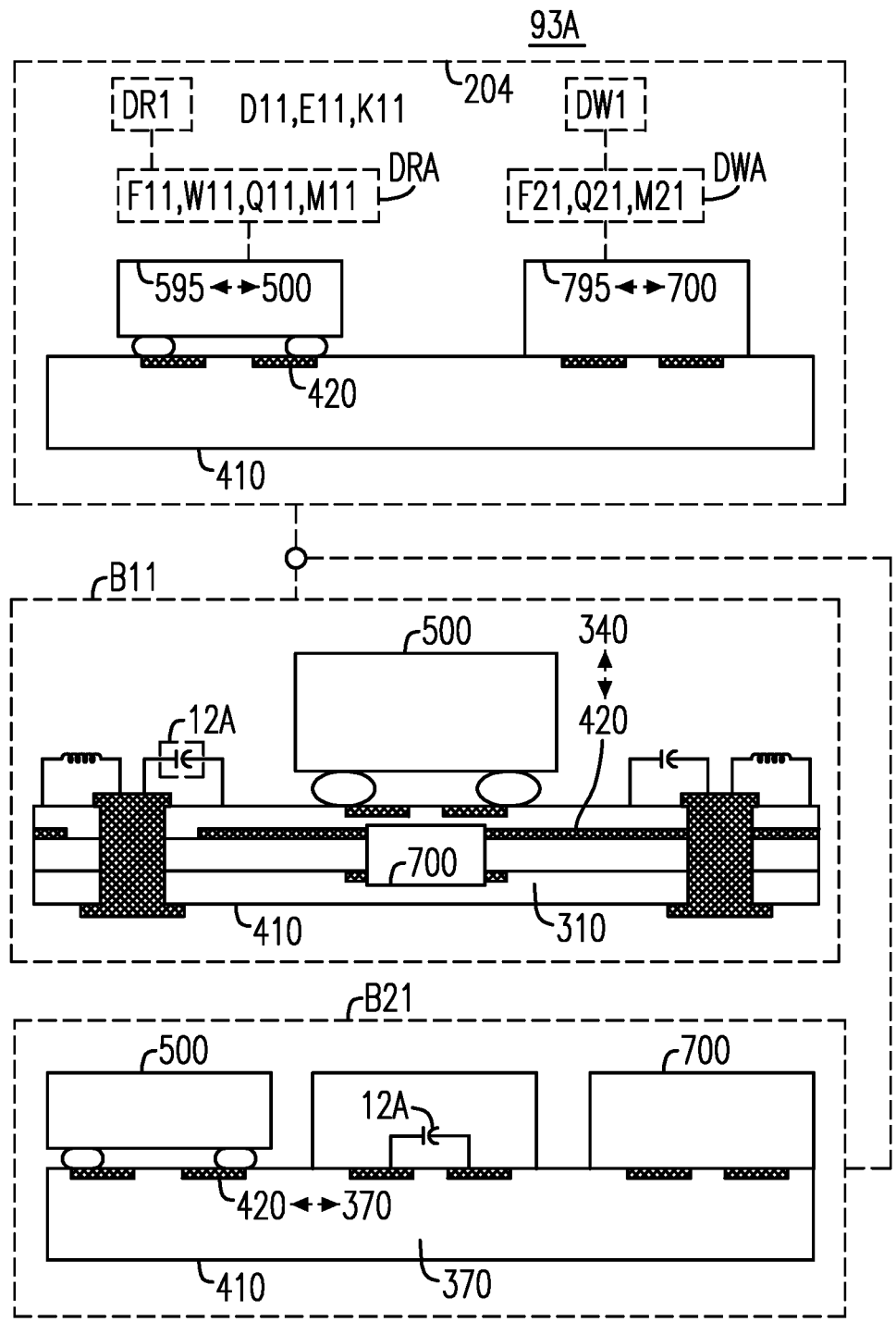
FIG. 11 is a schematic diagram showing an implementation structure of the signal processing system shown in FIG. 10.

Please refer to FIG. 11, which is a schematic diagram showing an implementation structure 93A of the signal processing system 930 shown in FIG. 10. As shown in FIG. 11, the implementation structure 93A includes the signal filter 204. The signal filter 204 is a hybrid signal filter, and further includes an impedance matching element 12A. In some embodiments, the first filtering unit 595, the first specific filtering property DRA and the first specific filtering operation URA are a notch filter 500, a band-rejection filtering property DR1 and a band-rejection filtering operation UR1 respectively. The first specific filtering property DRA further includes a first cutoff frequency F11 and a frequency bandwidth W11. The second filtering unit 795, the second specific filtering property DWA and the second specific filtering operation UWA are a wideband filter 700, a wideband filtering property DW1 and a wideband filtering operation UW1 respectively.

The first and the second cutoff frequencies F11 and F21 have a frequency difference D11 therebetween. A ratio E11 of the frequency difference D11 to the frequency bandwidth W11 is within a preset ratio range K11. For example, the preset ratio range K11 is from 2.5% to 20%. The coupling substrate 410 further supports the impedance matching element 12A. The impedance matching element 12A is electrically coupled to the notch filter 500 and the wideband filter 700 through the coupling circuit 420. The signal filter 204 is disposed in one of a first structure state B11 and a second structure state B21.

For example, under a condition that the signal filter 204 is in the first structure state B11: the coupling substrate 410 is an integrated multilayer substrate 310; the coupling circuit 420 is a structure circuit 340; each of the impedance matching element 12A and the notch filter 500 is disposed on the integrated multilayer substrate 310; and the wideband filter 700 is disposed in the integrated multilayer substrate 310. Under a condition that the signal filter 204 is in the second structure state B21: the coupling substrate 410 is a printed circuit board 360; the coupling circuit 420 is a printed circuit 370; and each of the impedance matching element 12A, the notch filter 500 and the wideband filter 700 is disposed on the printed circuit board 360. For example, the first filtering unit 595 is configured to perform the first specific filtering operation URA according to the first specific filtering property DRA. The second filtering unit 795 is configured to perform the second specific filtering operation UWA according to the second specific filtering property DWA. The wideband filter 700 is buried in the integrated multilayer substrate 310. The coupling substrate 410 is a substrate.

Figure 12:
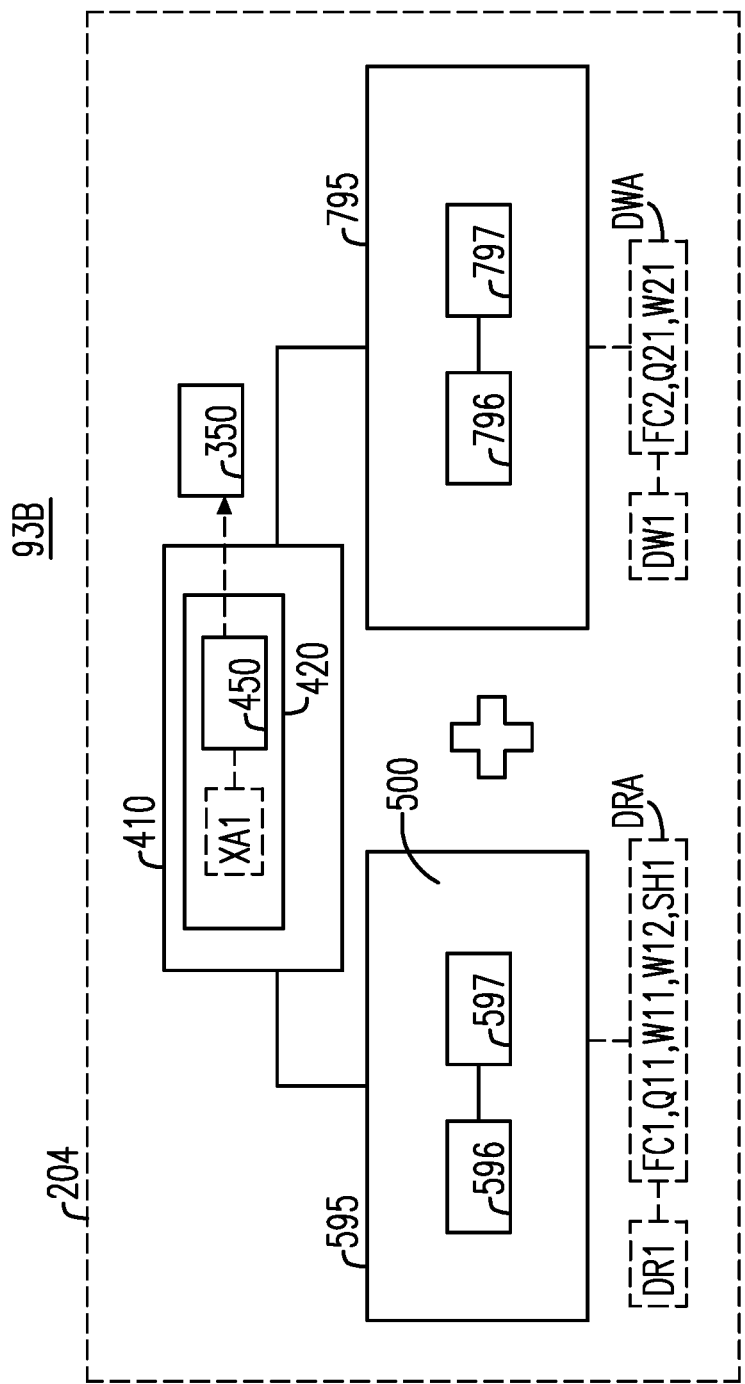
FIG. 12 is a schematic diagram showing an implementation structure of the signal processing system shown in FIG. 10.

Please refer to FIG. 12, which is a schematic diagram showing an implementation structure 93B of the signal processing system 930 shown in FIG. 10. As shown in FIG. 12, the implementation structure 93B includes the signal filter 204. The signal filter 204 includes the first filtering unit 595, the second filtering unit 795 and the coupling substrate 410, can be operated at a frequency of 5 GHz, is used for wideband filtering, and has high performance. The first filtering unit 595 is electrically coupled to the second filtering unit 795 through the coupling substrate 410. For example, the coupling substrate 410 is a heterogeneous coupling element. A communication system having a channel is a bandwidth system when a message bandwidth of the communication system significantly exceeds the coherence bandwidth of the channel.

The first filtering unit 595 is one of a notch element and a band-rejection element, and includes one of a resonator and a notch filter 500. The resonator is configured to meet a resonance property, which includes a relatively high quality factor. The notch filter 500 is configured to meet the band-rejection filtering property DR1, which includes the relatively high quality factor Q11. The second filtering unit 795 is a relatively strong coupling element. The relatively strong coupling element is coupled to the band-rejection element through the heterogeneous coupling element. The second filtering unit 795 includes one selected from a group consisting of the high-pass filter 720, the band-pass filter 730 and the low-pass filter 740. The first filtering unit 595 provides a feature of a good shape factor. The second filtering unit 795 provides a feature of strong coupling. The advantage of the signal filter 204 is that the feature of the strong coupling is effectively combined with the feature of the good shape factor.

In some embodiments, the second filtering unit 795 is a ceramic filter element, includes a device base body 796 and a filtering circuit 797 coupled to the device base body 796, and is configured to meet the second specific filtering property DWA, so that the second filtering unit 795 can be operated at a frequency of 5 GHz. The device base body 796 is made of a ceramic material. The second specific filtering property DWA includes a center frequency FC2, a relatively low quality factor Q21 and a second frequency bandwidth W21 (provided under a condition of −3 dB). The ceramic material has a relative dielectric constant. The relative dielectric constant ranges from 3.0 to 30.0. The relatively low quality factor Q21 is less than 950. A ratio of the second frequency bandwidth W21 to the center frequency FC2 ranges from 5% to 50%. For example, the second filtering unit 795 is an inductor-capacitor ladder filter. For example, the relatively low quality factor Q21 ranges from 50 to 150 for a specific wideband filter. For example, the relatively low quality factor Q21 ranges from 300 to 2000 for a specific wideband filter.

The first filtering unit 595 is one of a notch filter element and a band-rejection filter element, includes a device substrate 596 and a filtering circuit 597 coupled to the device substrate 596, and is configured to meet the first specific filtering property DRA, so that the first filtering unit 595 can be operated at a frequency of 5 GHz. The device substrate 596 is made of a piezoelectric material. The first specific filtering property DRA includes a center frequency FC1, a relatively high quality factor Q11, a frequency bandwidth W11 (provided under a condition of −3 dB (or 3 dB of power attenuation)), a frequency bandwidth W12 provided under a condition of −20 dB (or 20 dB of power attenuation), and a shape factor SH1. The shape factor SH1 is equal to a ratio of the frequency bandwidth W12 to the frequency bandwidth W11. The piezoelectric material has a relative dielectric constant, and belongs to one selected from a plurality of piezoelectric material types. For example, the first filtering unit 595 is a Surface-Acoustic-Wave (SAW) ladder filter. As shown in Table 1, the plurality of piezoelectric material types and the properties thereof are listed as follows:

TABLE 1

| Piezoelectric Substrate | Velocity (m/s) | Temperature Coefficient Tc (ppm/° C.) | Coupling Coefficient (K2 %) | Quality Factor |
|---|---|---|---|---|
| YZ Lithium Niobate (LN-YZ) | 3488 | −94 | 4.6 | |
| 128° Lithium Niobate (LN-128) | 3895 | −74 | 5.6 | 550 |
| Quartz STW (Qz All Cut) | 5000 | −0.05 ppm/° C.2 | 0.15 | 3300 |
| Quartz (Qz All Cut) | 3158 | −0.033 ppm/° C.2 | 0.12 | 3300 |
| 112° Lithium Tantalate (LT-112) | 3300 | −18 | 0.6 | −1000 |
| 41° Lithium Niobate (LN-41) | 4790 | −50 | 17.2 | 500 |
| 64° Lithium Niobate (LN-64) | 4744 | −75 | 12.5 | 1100 |
| 42° Lithium Tantalate (LT-42) | 4211 | −38 | 7.6 | −800 |

The relatively high quality factor Q11 ranges from 300 to 6000. Under a condition that the piezoelectric material belongs to a quartz material type: a ratio of the frequency bandwidth W11 to the center frequency FC1 ranges from 0.01% to 0.1%; the relative dielectric constant of the piezoelectric material is equal to 3.8; and the shape factor SH1 ranges from 0.4 to 0.8. Under a condition that the piezoelectric material belongs to a lithium-tantalate material type: a ratio of the frequency bandwidth W11 to the center frequency FC1 ranges from 2% to 4%; the relative dielectric constant of the piezoelectric material is equal to 43.0; and the shape factor SH1 ranges from 0.4 to 0.8. Under a condition that the piezoelectric material belongs to a lithium-niobate material type: a ratio of the frequency bandwidth W11 to the center frequency FC1 ranges from 2% to 8%; the relative dielectric constant of the piezoelectric material is equal to 85.2; and the shape factor SH1 ranges from 0.4 to 0.8.

In some embodiments, the coupling substrate 410 includes the coupling circuit 420. The coupling circuit 420 includes a matching network 450. The matching network 450 is an impedance matching network, and is used to form a matching impedance XA1. The first filtering unit 595 matches the second filtering unit 795 through the matching network 450 to achieve a desired electrical feature. The desired electrical feature is provided by using the matching network 450. The matching network 450 belongs to a matching network type 350. The matching network type 350 is one selected from a plurality of network types.

Figure 13A:
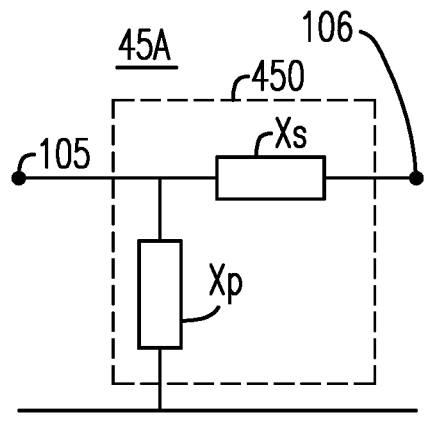
FIG. 13A, FIG. 13B, FIG. 13C and FIG. 13D are schematic diagrams respectively showing a plurality of implementation structures of a matching network shown in FIG. 12.

Please refer to FIG. 13A, FIG. 13B, FIG. 13C and FIG. 13D, which are schematic diagrams respectively showing a plurality of implementation structures 45A, 45B, 45C and 45D of the matching network 450 shown in FIG. 12. Under a condition that the second filtering unit 795 includes the high-pass filter 720, the matching network type 350 is one selected from a group consisting of a first L-shaped network type, a π-shaped network type and a T-shaped network type. Under a condition that the second filtering unit 795 includes the low-pass filter 740, the matching network type 350 is a second L-shaped network type. FIG. 13A shows the implementation structure 45A belonging to the first L-shaped network type.

Figure 13B:
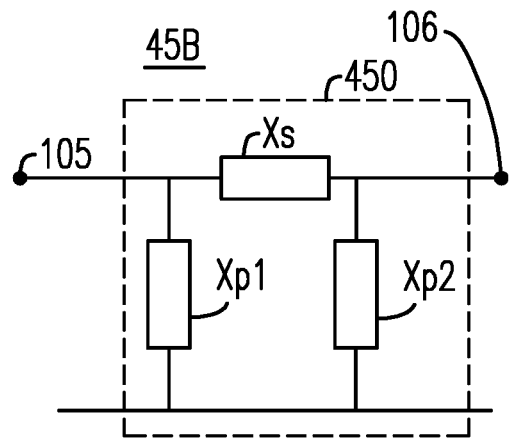
Figure 13C:
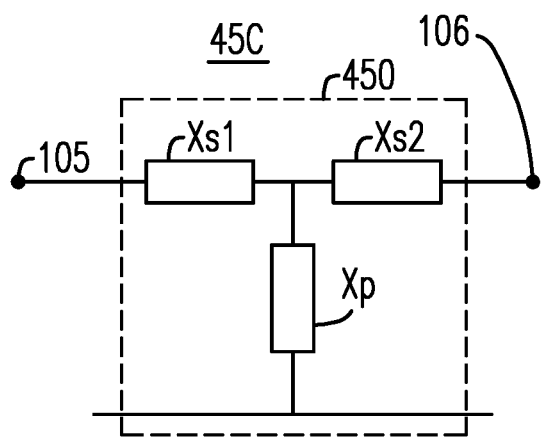
Figure 13D:
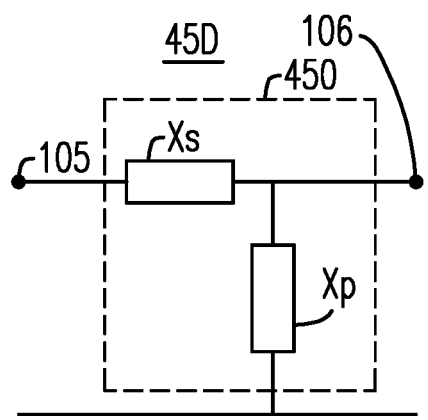

As shown in FIG. 13A, the implementation structure 45A of the matching network 450 is an L-shaped circuit, and includes a capacitor Xs and an inductor Xp. For example, the impedance matching elements 12A and 12B are respectively equal to the capacitor Xs and the inductor Xp. As shown in FIG. 13B, the implementation structure 45B of the matching network 450 is a π-shaped circuit, and includes a capacitor Xs, an inductor Xp1 and an inductor Xp2. For example, the impedance matching element 12B is equal to one of the inductors Xp1 and Xp2. As shown in FIG. 13C, the implementation structure 45C of the matching network 450 is a T-shaped circuit, and includes a capacitor Xs1, a capacitor Xs2 and an inductor Xp. For example, the impedance matching element 12A is equal to one of the capacitors Xs1 and Xs2. As shown in FIG. 13D, the implementation structure 45D of the matching network 450 is an L-shaped circuit, and includes a capacitor Xs and an inductor Xp.

Figure 14:
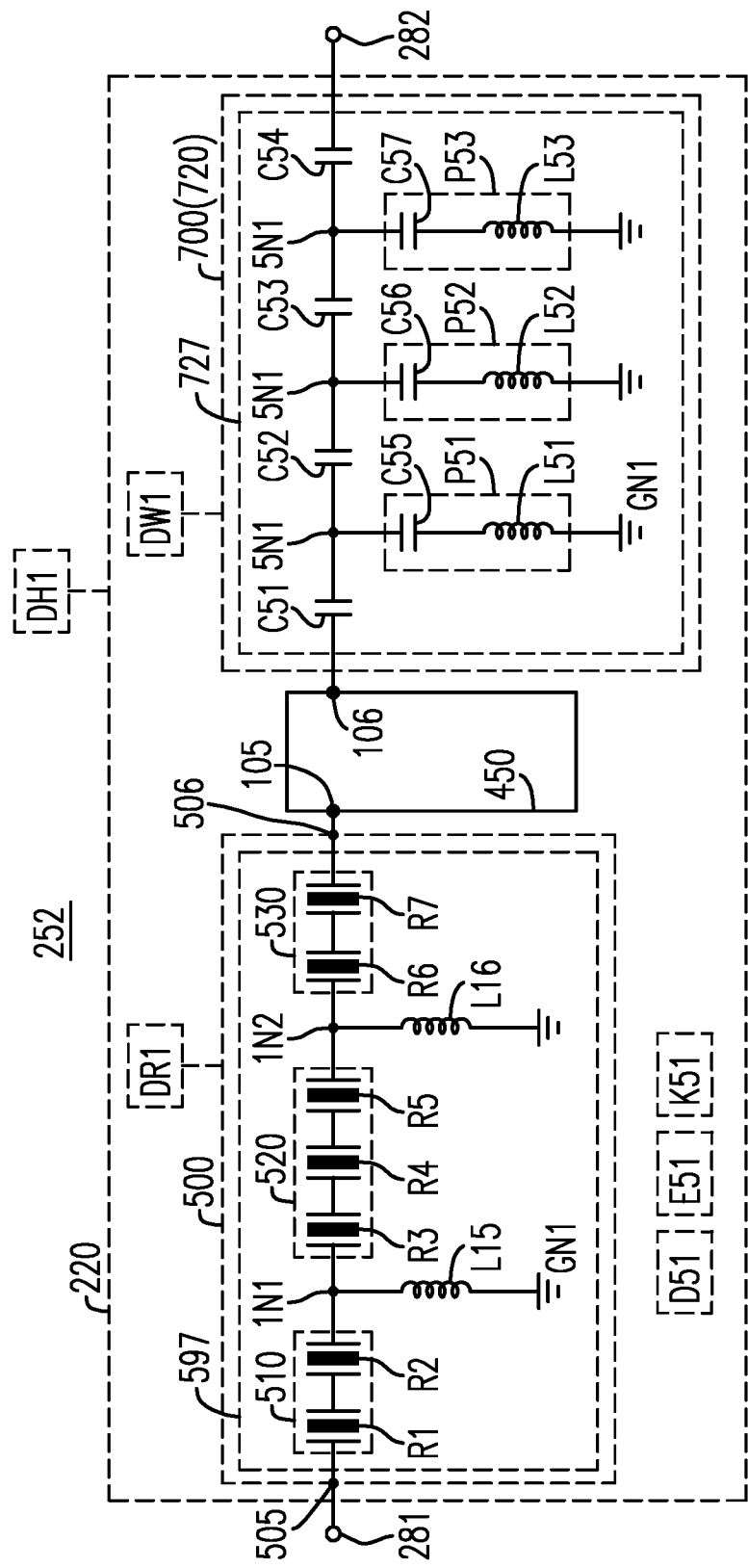
FIG. 14 is a schematic diagram showing an equivalent circuit of a signal filter serving as a high-pass filtering element according to various embodiments of the present disclosure.
Figure 15:
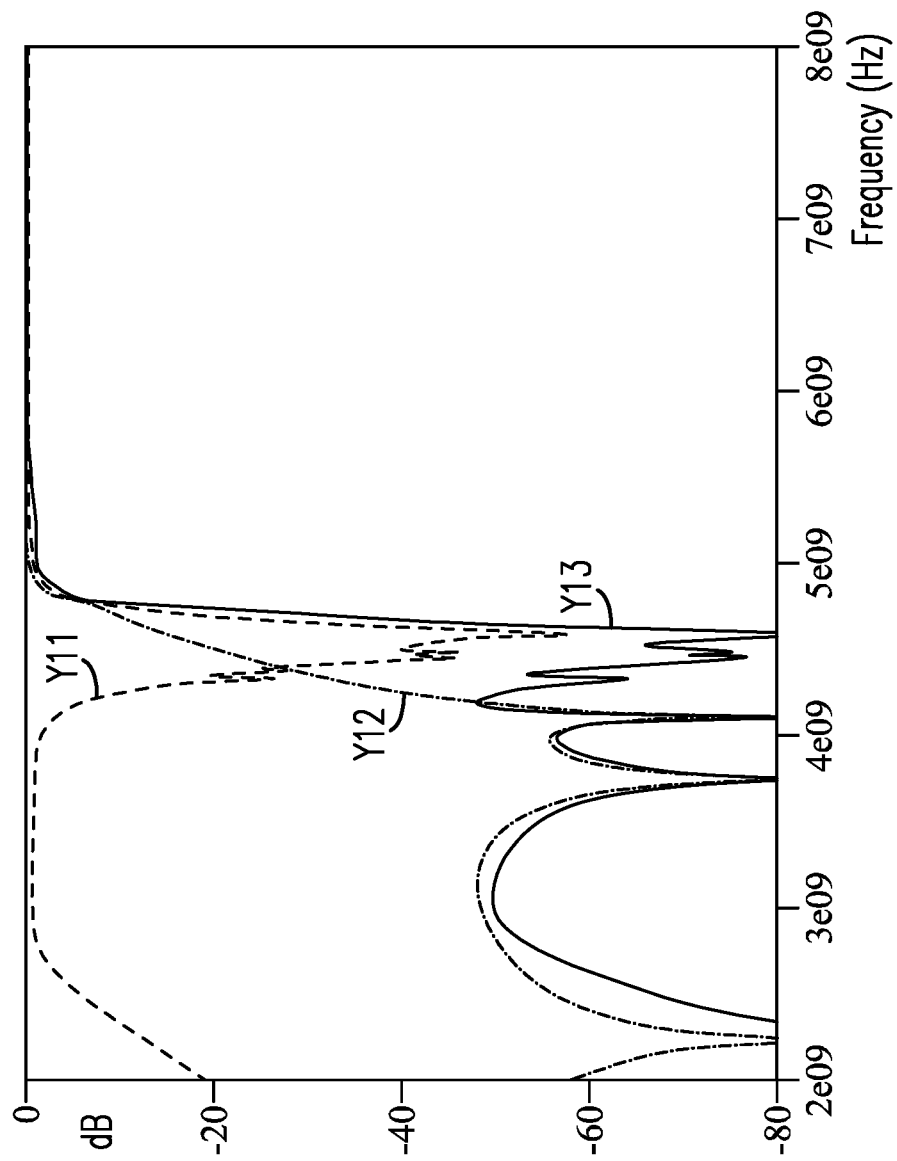
FIG. 15 is a schematic diagram showing a filtering output property of the signal filter shown in FIG. 14.
Figure 16:
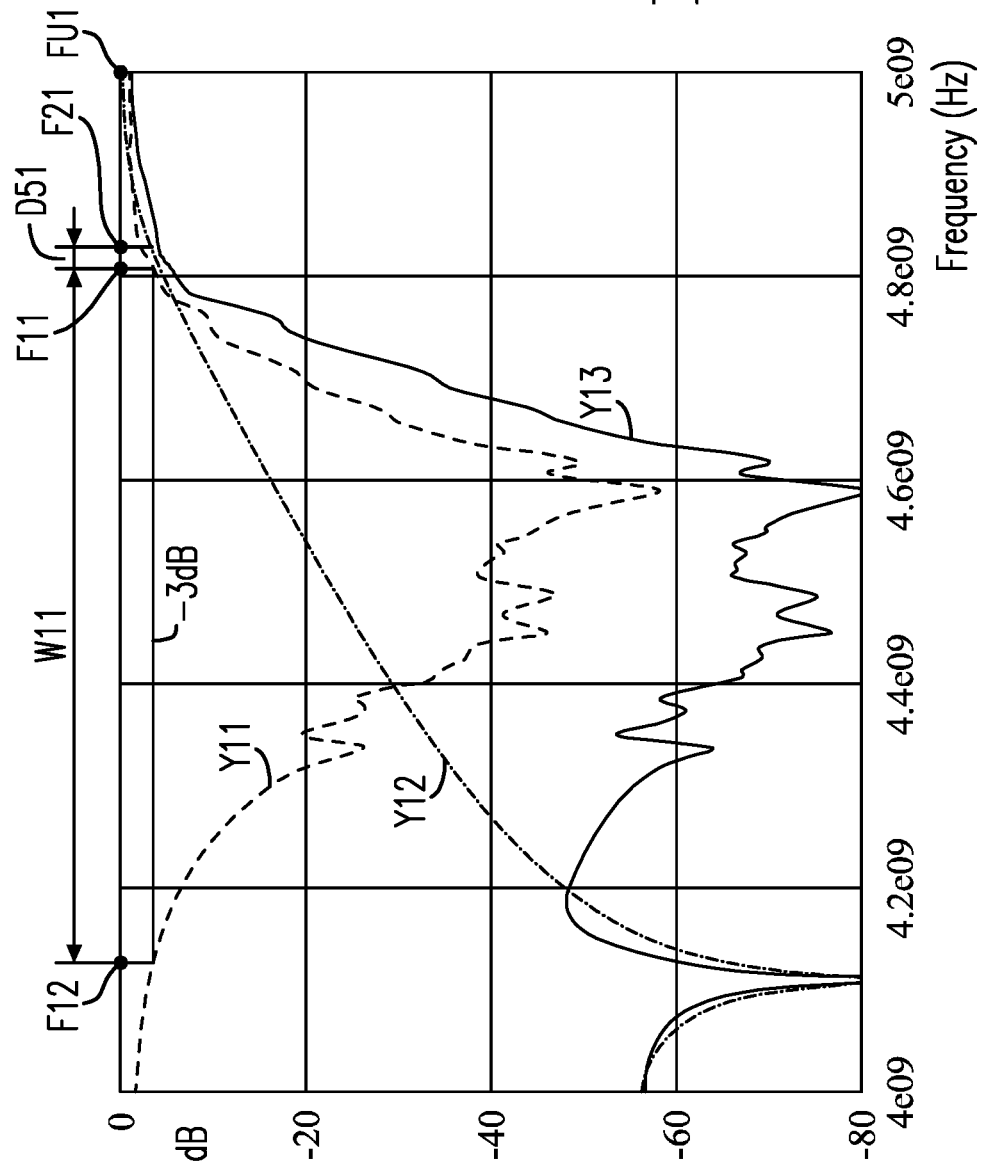
FIG. 16 is a schematic diagram showing a specific filtering property of the filtering output property, shown in FIG. 15, within a specific frequency range.

Please refer to FIG. 14, FIG. 15 and FIG. 16. FIG. 14 is a schematic diagram showing an equivalent circuit of a signal filter 252 serving as a high-pass filtering element 220 according to various embodiments of the present disclosure. FIG. 15 is a schematic diagram showing a filtering output property of the signal filter 252 shown in FIG. 14. FIG. 16 is a schematic diagram showing a specific filtering property of the filtering output property, shown in FIG. 15, within a specific frequency range. For example, the signal filter 252 is any of the plurality of signal filters 202, 204, 206 and 208. The high-pass filtering element 220 includes a first port 281, a second port 282 being opposite to the first port 281, a notch filter 500, a wideband filter 700 and a matching network 450. The wideband filter 700 is the high-pass filter 720. For example, the first and the second ports 281 and 282 are an input port and an output port respectively.

The notch filter 500, the wideband filter 700 (or the high-pass filter 720) and the high-pass filtering element 220 respectively meet a band-rejection filtering property DR1, a wideband filtering property DW1 (or a high-pass filtering property) and a high-pass filtering property DH1. FIG. 14 shows a filtering property curve Y11, a filtering property curve Y12 and a filtering property curve Y13. The filtering property curve Y11 is used to represent the band-rejection filtering property DR1. The filtering property curve Y12 is used to represent the wideband filtering property DW1 (or a high-pass filtering property). The filtering property curve Y13 is used to represent the high-pass filtering property DH1.

In some embodiments, the matching network 450 is coupled to and disposed between the notch filter 500 and the high-pass filter 720, and has a connection terminal 105 and a connection terminal 106 being opposite to the connection terminal 105. The notch filter 500 is coupled between the first port 281 and the connection terminal 105, and includes a filtering circuit 597. The filtering circuit 597 includes a series circuit 510, a series circuit 520, a series circuit 530, a shunt inductor L15, a shunt inductor L16, a node 1N1 and a node 1N2. The plural series circuits 510, 520 and 530 are coupled to and disposed between the first port 281 and the connection terminal 105 in series.

The series circuit 510 is coupled to and disposed between the first port 281 and the node 1N1, and includes a series resonator R1 and a series resonator R2. The series circuit 520 is coupled to and disposed between the nodes 1N1 and 1N2, and includes a series resonator R3, a series resonator R4 and a series resonator R5. The series circuit 530 is coupled to and disposed between the node 1N2 and the connection terminal 105, and includes a series resonator R6 and a series resonator R7. The shunt inductor L15 is coupled to and disposed between the node 1N1 and a ground GN1. The shunt inductor L16 is coupled to and disposed between the node 1N2 and the ground GN1. For example, the plural series resonators R1, R2, R3, R4, R5, R6 and R7 are respectively plural acoustic-wave resonators, or plural Surface-Acoustic-Wave (SAW) resonators.

In some embodiments, the high-pass filter 720 is coupled to and disposed between the connection terminal 106 and the second port 282, and includes a filtering circuit 727. The filtering circuit 727 includes a plurality of series capacitors C51, C52, C53 and C54, a plurality of shunt inductor-capacitor (LC) resonance circuits P51, P52 and P53, and a plurality of nodes 5N1, 5N2 and 5N3. The plurality of series capacitors C51, C52, C53 and C54 is coupled to and disposed between the connection terminal 106 and the second port 282 in series. The series capacitor C51 is electrically connected between the connection terminal 106 and the node 5N1. The series capacitor C52 is electrically connected between the nodes 5N1 and 5N2. The series capacitor C53 is electrically connected between the nodes 5N2 and 5N3. The series capacitor C54 is electrically connected between the node 5N3 and the second port 282.

The shunt LC resonance circuit P51 is coupled to and disposed between the node 5N1 and the ground GN1, and includes a capacitor C55 and an inductor L51 connected in series with the capacitor C55. The shunt LC resonance circuit P52 is coupled to and disposed between the node 5N2 and the ground GN1, and includes a capacitor C56 and an inductor L52 connected in series with the capacitor C56. The shunt LC resonance circuit P53 is coupled to and disposed between the node 5N3 and the ground GN1, and includes a capacitor C57 and an inductor L53 connected in series with the capacitor C57. For example, under a condition that the wideband filter 700 is equal to the high-pass filter 720, the filtering circuit 797 is equal to the filtering circuit 727.

For example, the plurality of series capacitors C51, C52, C53 and C54 respectively have a first plurality of measured capacitances; and the first plurality of measured capacitances are respectively equal to 620 fF, 430 fF, 510 fF and 820 fF. The plurality of capacitors C55, C56 and C57 respectively have a second plurality of measured capacitances; and the second plurality of measured capacitances are respectively equal to 3.9 pF, 750 fF and 1 pF. The plurality of inductors L51, L52 and L53 respectively have a plurality of measured inductances; and the plurality of measured inductances are respectively equal to 1.3 nH, 2 nH and 1.8 nH.

The band-rejection filtering property DR1 includes the first cutoff frequency F11, a cutoff frequency F12 and a frequency bandwidth W11. The frequency bandwidth W11 is equal to a frequency difference between the first cutoff frequency F11 and the cutoff frequency F12. The wideband filtering property DW1 includes a second cutoff frequency F21. The first and the second cutoff frequencies F11 and F21 have a frequency difference D51 therebetween. According the illustration in FIG. 16, a ratio E51 of the frequency difference D51 to the frequency bandwidth W11 is within a preset ratio range K51, wherein the preset ratio range K51 is from 2.5% (i.e. 2.5 percent) to 10% (i.e. 10 percent). For example, preferably, the first cutoff frequency F11 is equal to 4.8062 GHz. The cutoff frequency F12 is equal to 4.1312 GHz. The second cutoff frequency F21 is equal to 4.8281 GHz. The ratio E51 is equal to 3.24%.

For example, any of the plurality of signal filters 202, 204, 206 and 208 has a characteristic frequency FU1, and is used for a filtering application of a specific frequency range. The specific frequency range is from 1 GHz to 10 GHz. The first cutoff frequency F11 and the characteristic frequency FU1 have a frequency difference. A ratio of the frequency difference to the characteristic frequency FU1 is less than 10%. For example, the characteristic frequency FU1 is equal to 5 GHz. A first frequency difference between the first and the second cutoff frequencies F11 and F21 is less than a second frequency difference between the cutoff frequency F12 and the second cutoff frequency F21. For example, the notch filter 500 includes the connection terminal 505 and the connection terminal 506 being opposite to the connection terminal 505. The connection terminal 505 is coupled to the first port 281. The connection terminal 506 is coupled to the connection terminal 105.

Figure 17:
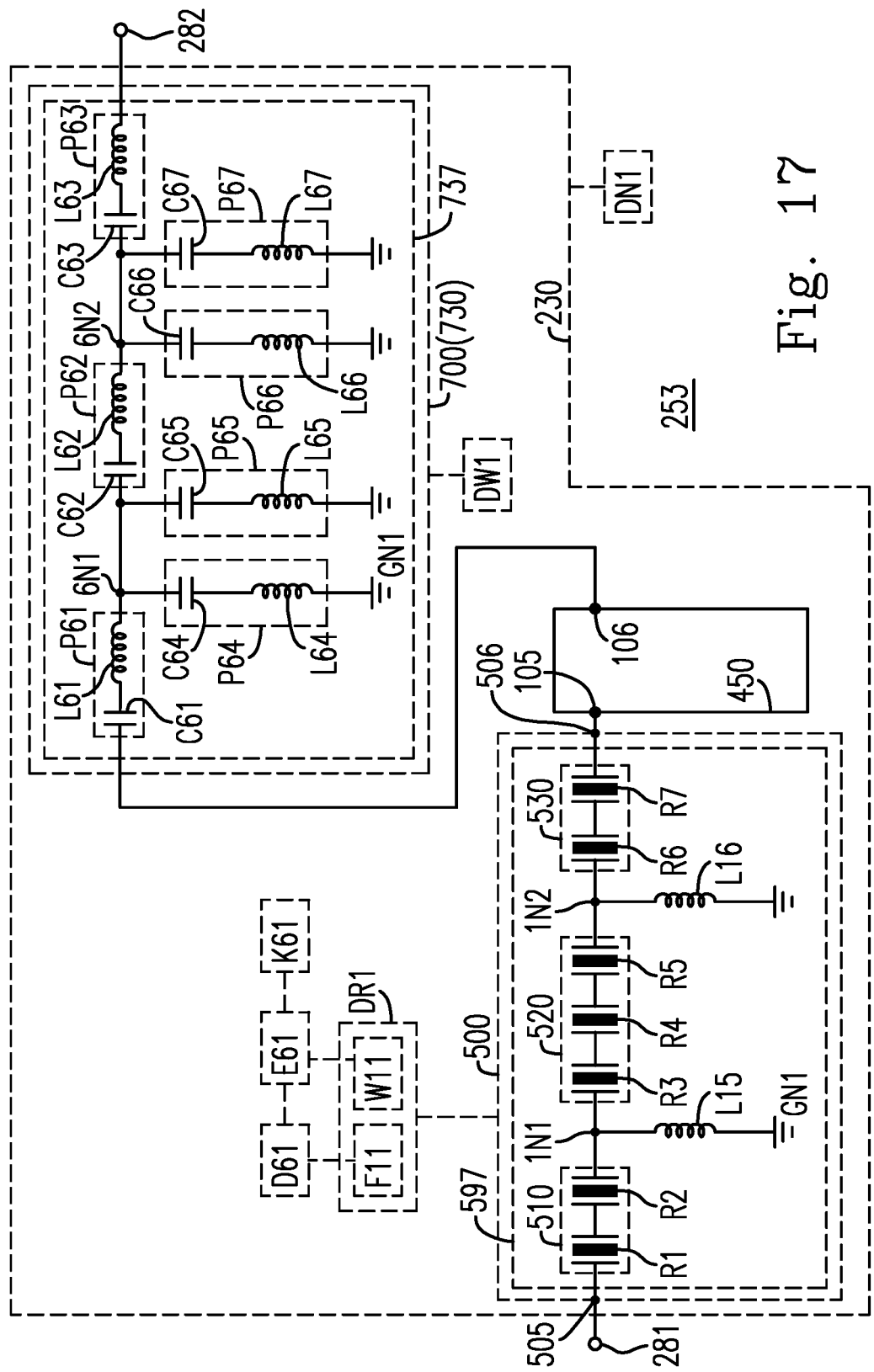
FIG. 17 is a schematic diagram showing an equivalent circuit of a signal filter serving as a band-pass filtering element according to various embodiments of the present disclosure.
Figure 18:
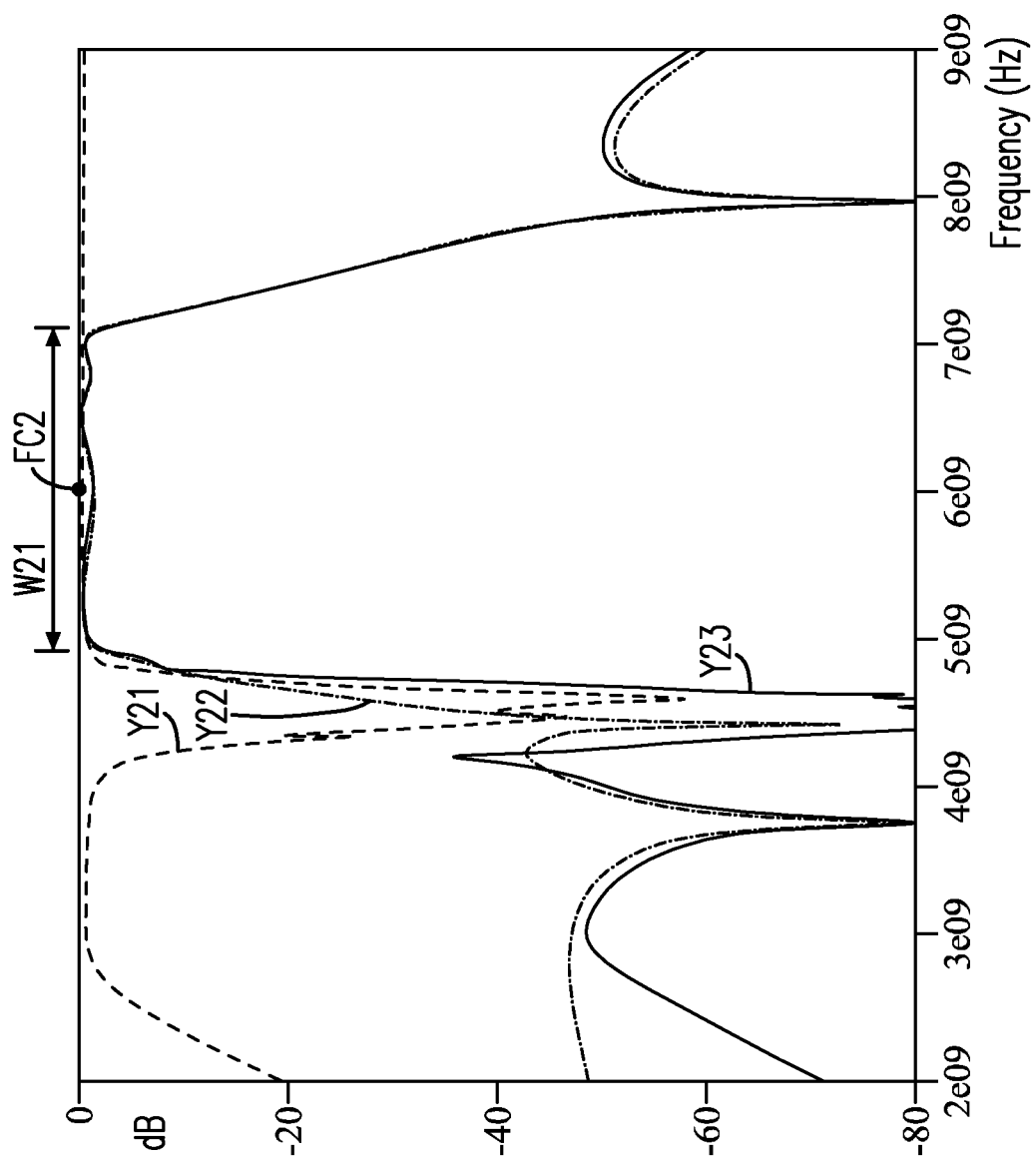
FIG. 18 is a schematic diagram showing a filtering output property of the signal filter shown in FIG. 17.
Figure 19:
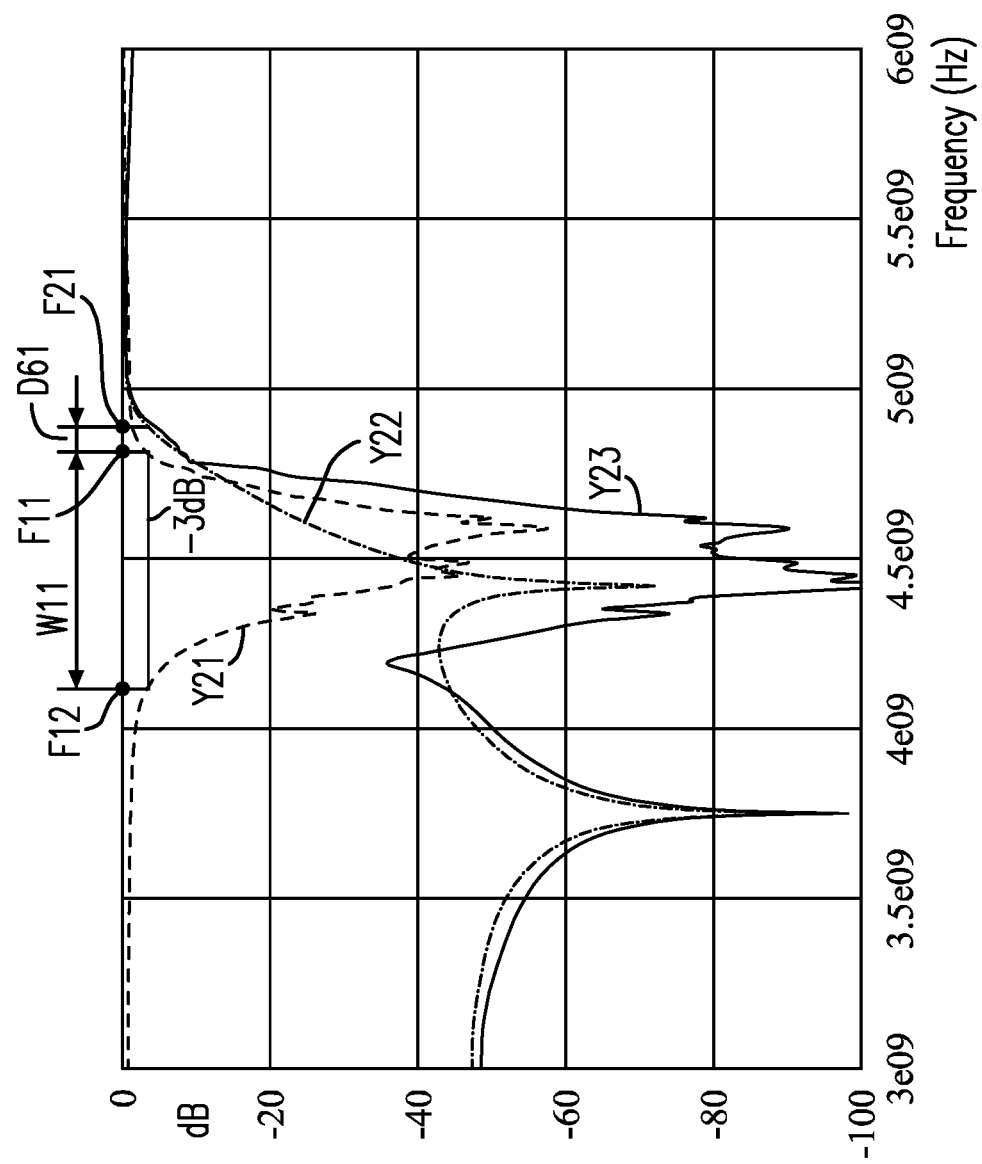
FIG. 19 is a schematic diagram showing a specific filtering property of the filtering output property, shown in FIG. 18, within a specific frequency range.

Please refer to FIG. 17, FIG. 18 and FIG. 19. FIG. 17 is a schematic diagram showing an equivalent circuit of a signal filter 253 serving as a band-pass filtering element 230 according to various embodiments of the present disclosure. FIG. 18 is a schematic diagram showing a filtering output property of the signal filter 253 shown in FIG. 17. FIG. 19 is a schematic diagram showing a specific filtering property of the filtering output property, shown in FIG. 18, within a specific frequency range. For example, the signal filter 253 is any of the plurality of signal filters 202, 204, 206 and 208. The band-pass filtering element 230 includes a first port 281, a second port 282 being opposite to the first port 281, a notch filter 500, a wideband filter 700 and a matching network 450. The wideband filter 700 is the band-pass filter 730. For example, the first and the second ports 281 and 282 are an input port and an output port respectively.

The notch filter 500, the wideband filter 700 (or the band-pass filter 730) and the band-pass filtering element 230 respectively meet a band-rejection filtering property DR1, a wideband filtering property DW1 (or a band-pass filtering property) and a band-pass filtering property DN1. FIG. 17 shows a filtering property curve Y21, a filtering property curve Y22 and a filtering property curve Y23. The filtering property curve Y21 is used to represent the band-rejection filtering property DR1. The filtering property curve Y22 is used to represent the wideband filtering property DW1 (or a band-pass filtering property). The filtering property curve Y23 is used to represent the band-pass filtering property DN1. The matching network 450 is coupled to and disposed between the notch filter 500 and the band-pass filter 730, and has a connection terminal 105 and a connection terminal 106 being opposite to the connection terminal 105. For example, the notch filter 500 of the band-pass filtering element 230 and the notch filter 500 of the high-pass filtering element 220 have the same circuit structures.

In some embodiments, the band-pass filter 730 is coupled to and disposed between the connection terminal 106 and the second port 282, and includes a filtering circuit 737. The filtering circuit 737 includes a plurality of series inductor-capacitor (LC) resonance circuit P61, P62 and P63, a plurality of shunt LC resonance circuits P64, P65, P66 and P67, a node 6N1, and a node 6N2. The plurality of series LC resonance circuits P61, P62 and P63 are coupled to and disposed between the connection terminal 106 and the second port 282 in series.

The series LC resonance circuit P61 is electrically connected between the connection terminal 106 and the node 6N1, and includes a capacitor C61 and an inductor L61 connected in series with the capacitor C61. The series LC resonance circuit P62 is electrically connected between the nodes 6N1 and 6N2, and includes a capacitor C62 and an inductor L62 connected in series with the capacitor C62. The series LC resonance circuit P63 is electrically connected between the node 6N2 and the second port 282, and includes a capacitor C63 and an inductor L63 connected in series with the capacitor C63.

In some embodiments, the shunt LC resonance circuit P64 is connected in parallel with the shunt LC resonance circuit P65. Each of the shunt LC resonance circuits P64 and P65 is coupled to and disposed between the node 6N1 and the ground GN1. The shunt LC resonance circuit P66 is connected in parallel with the shunt LC resonance circuit P67. Each of the shunt LC resonance circuits P66 and P67 is coupled to and disposed between the node 6N2 and the ground GN1.

The shunt LC resonance circuit P64 includes a capacitor C64 and an inductor L64 connected in series with the capacitor C64. The shunt LC resonance circuit P65 includes a capacitor C65 and an inductor L65 connected in series with the capacitor C65. The shunt LC resonance circuit P66 includes a capacitor C66 and an inductor L64 connected in series with the capacitor C66. The shunt LC resonance circuit P67 includes a capacitor C67 and an inductor L67 connected in series with the capacitor C67. For example, under a condition that the wideband filter 700 is equal to the band-pass filter 730, the filtering circuit 797 is equal to the filtering circuit 737.

For example, the plurality of capacitors C61, C62, C63, C64, C65, C66 and C67 respectively have a plurality of measured capacitances; and the plurality of measured capacitances are respectively equal to 180 fF, 110 fF, 270 fF, 470 fF, 1.2 pF, 200 fF and 360 fF. The plurality of inductors L61, L62, L63, L64, L65, L66 and L67 respectively have a plurality of measured inductances; and the plurality of measured inductances are respectively equal to 4.3 nH, 6.8 nH, 3.6 nH, 620 pH, 1.5 nH, 2 nH and 3.6 nH.

The band-rejection filtering property DR1 includes the first cutoff frequency F11, a cutoff frequency F12 and a frequency bandwidth W11. The frequency bandwidth W11 is equal to a frequency difference between the first cutoff frequency F11 and the cutoff frequency F12. The wideband filtering property DW1 (or a band-pass filtering property) includes a second cutoff frequency F21. The first and the second cutoff frequencies F11 and F21 have a frequency difference D61 therebetween. According the illustration in FIG. 19, a ratio E61 of the frequency difference D61 to the frequency bandwidth W11 is within a preset ratio range K61, wherein the preset ratio range K61 is from 5% (i.e. 5 percent) to 20% (i.e. 20 percent).

For example, preferably, the first cutoff frequency F11 is equal to 4.8062 GHz. The cutoff frequency F12 is equal to 4.1312 GHz. The second cutoff frequency F21 is equal to 4.8875 GHz. The ratio E61 is equal to 12.0%. For example, under a condition that the wideband filtering property DW1 is equal to the band-pass filtering property, the wideband filtering property DW1 further includes a specific cutoff frequency being different from (or opposite to) the second cutoff frequency F21. The second frequency bandwidth W21 of the band-pass filter 730 is equal to a frequency difference between the specific cutoff frequency and the second cutoff frequency F21.

Figure 20:
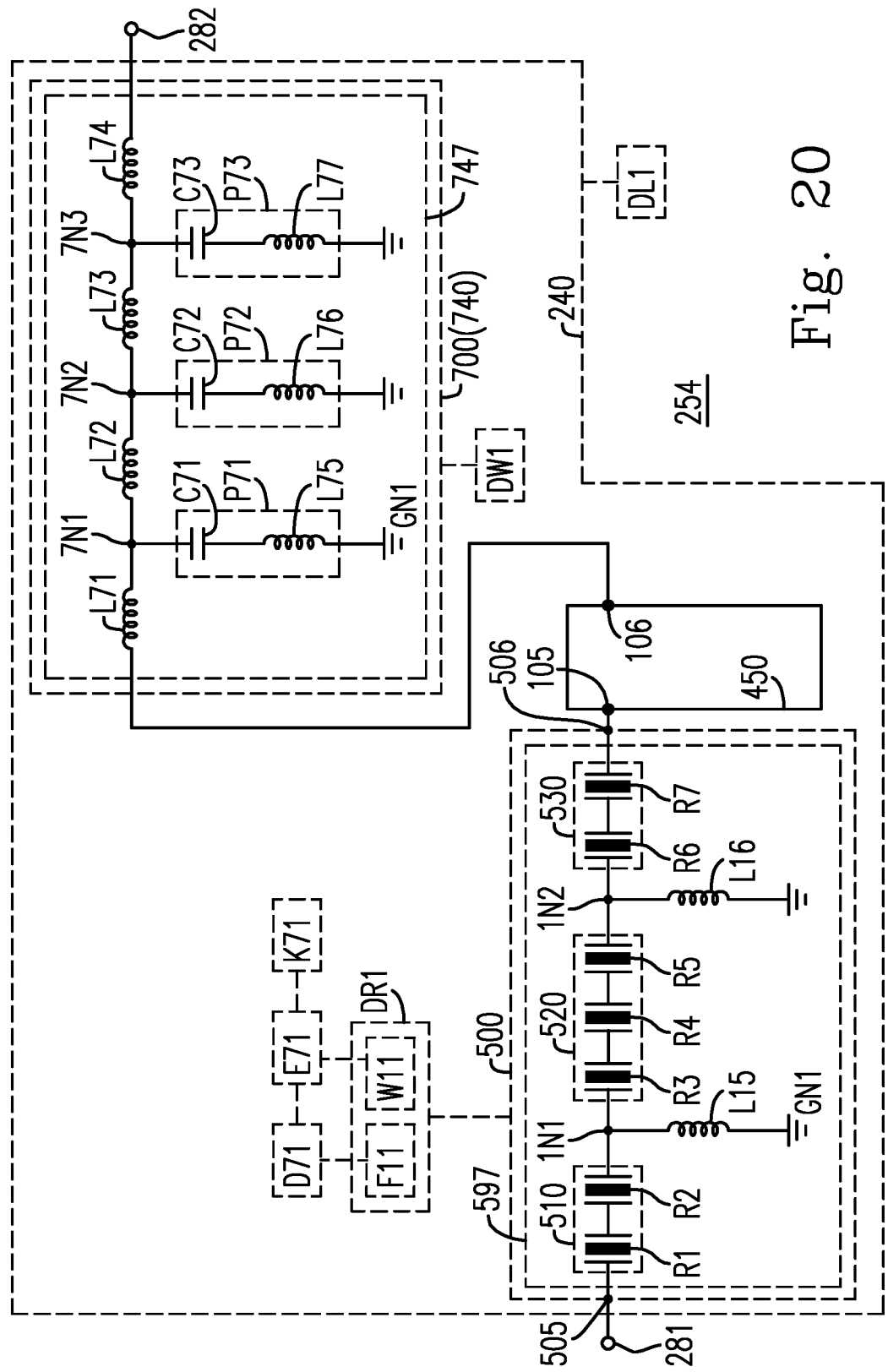
FIG. 20 is a schematic diagram showing an equivalent circuit of a signal filter serving as a low-pass filtering element according to various embodiments of the present disclosure.
Figure 21:
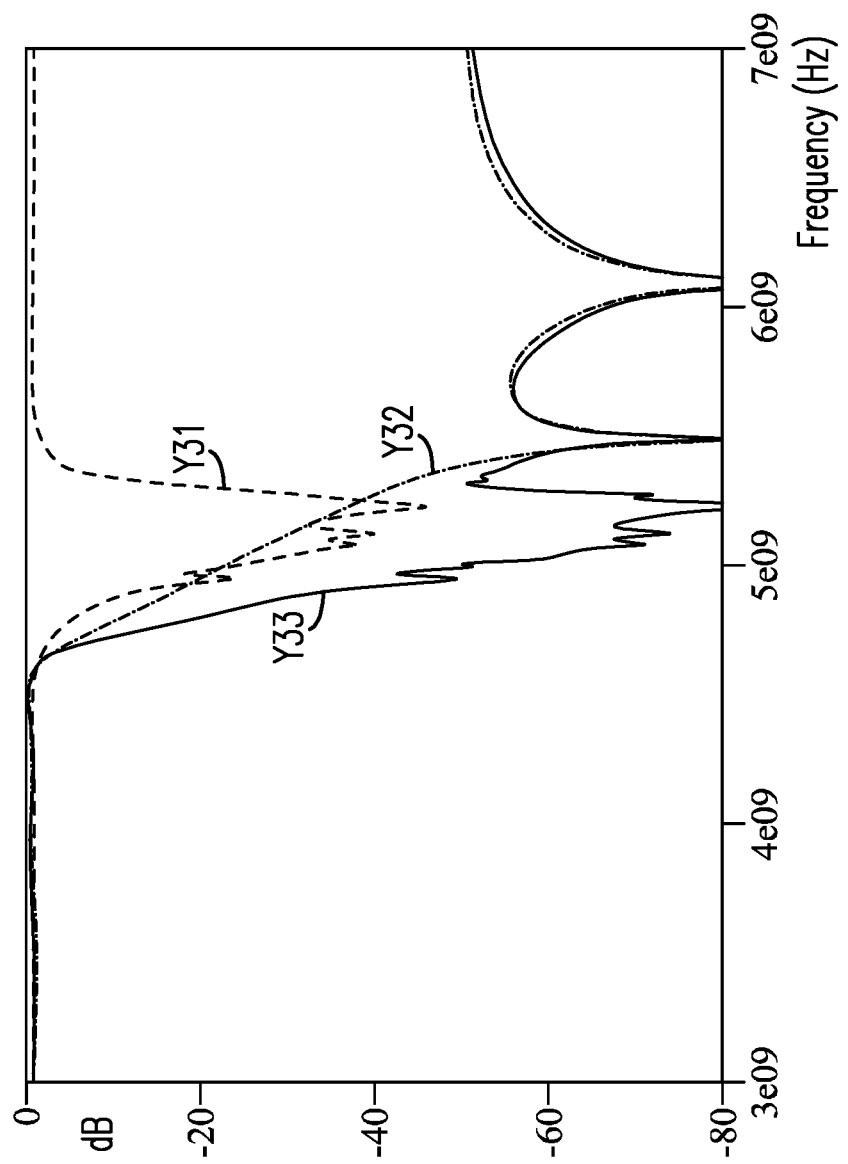
FIG. 21 is a schematic diagram showing a filtering output property of the signal filter shown in FIG. 20.

Please refer to FIG. 20, FIG. 21 and FIG. 22. FIG. 20 is a schematic diagram showing an equivalent circuit of a signal filter 254 serving as a low-pass filtering element 240 according to various embodiments of the present disclosure. FIG. 21 is a schematic diagram showing a filtering output property of the signal filter 254 shown in FIG. 20. FIG. 22 is a schematic diagram showing a specific filtering property of the filtering output property, shown in FIG. 21, within a specific frequency range. For example, the signal filter 254 is any of the plurality of signal filters 202, 204, 206 and 208. The low-pass filtering element 240 includes a first port 281, a second port 282 being opposite to the first port 281, a notch filter 500, a wideband filter 700 and a matching network 450. The wideband filter 700 is the low-pass filter 740. For example, the first and the second ports 281 and 282 are an input port and an output port respectively.

The notch filter 500, the wideband filter 700 (or the low-pass filter 740) and the low-pass filtering element 240 respectively meet a band-rejection filtering property DR1, a wideband filtering property DW1 (or a low-pass filtering property) and a low-pass filtering property DL1. FIG. 20 shows a filtering property curve Y31, a filtering property curve Y32 and a filtering property curve Y33. The filtering property curve Y31 is used to represent the band-rejection filtering property DR1. The filtering property curve Y32 is used to represent the wideband filtering property DW1 (or a low-pass filtering property). The filtering property curve Y33 is used to represent the low-pass filtering property DL1. The matching network 450 is coupled to and disposed between the notch filter 500 and the low-pass filter 740, and has a connection terminal 105 and a connection terminal 106 being opposite to the connection terminal 105. For example, the notch filter 500 of the low-pass filtering element 240 and the notch filter 500 of the high-pass filtering element 220 have the same circuit structures.

In some embodiments, the low-pass filter 740 is coupled to and disposed between the connection terminal 106 and the second port 282, and includes a filtering circuit 747. The filtering circuit 747 includes a plurality of series inductors L71, L72, L73 and L74, a plurality of shunt inductor-capacitor (LC) resonance circuit P71, P72 and P73, and a plurality of nodes 7N1, 7N2 and 7N3. The plurality of series inductors L71, L72, L73 and L74 is coupled to and disposed between the connection terminal 106 and the second port 282 in series. The series inductor L71 is electrically connected between the connection terminal 106 and the node 7N1. The series inductor L72 is electrically connected between the nodes 7N1 and 7N2. The series inductor L73 is electrically connected between the nodes 7N2 and 7N3. The series inductor L74 is electrically connected between the node 7N3 and the second port 282.

The shunt LC resonance circuit P71 is coupled to and disposed between the node 7N1 and the ground GN1. The shunt LC resonance circuit P72 is coupled to and disposed between the node 7N2 and the ground GN1. The shunt LC resonance circuit P73 is coupled to and disposed between the node 7N3 and the ground GN1. The shunt LC resonance circuit P71 includes a capacitor C71 and an inductor L75 connected in series with the capacitor C71. The shunt LC resonance circuit P72 includes a capacitor C72 and an inductor L76 connected in series with the capacitor C72. The shunt LC resonance circuit P73 includes a capacitor C73 and an inductor L77 connected in series with the capacitor C73. For example, under a condition that the wideband filter 700 is equal to the low-pass filter 740, the filtering circuit 797 is equal to the filtering circuit 747.

For example, the plurality of series inductors L71, L72, L73 and L74 respectively have a first plurality of measured inductances; and the first plurality of measured inductances are respectively equal to 1.8 nH, 2.7 nH, 2.2 nH and 1.3 nH. The plurality of capacitors C71, C72 and C73 respectively have a plurality of measured capacitances; and the plurality of measured capacitances are respectively equal to 910 fF, 560 fF and 620 fF. The plurality of inductors L75, L76 and L77 respectively have a second plurality of measured inductances; and the second plurality of measured inductances are respectively equal to 300 pH, 1.5 nH and 1.1 nH.

The band-rejection filtering property DR1 includes the first cutoff frequency F11, a cutoff frequency F12 and a frequency bandwidth W11. The frequency bandwidth W11 is equal to a frequency difference between the first cutoff frequency F11 and the cutoff frequency F12. The wideband filtering property DW1 includes a second cutoff frequency F21. The first and the second cutoff frequencies F11 and F21 have a frequency difference D71 therebetween. According the illustration in FIG. 22, a ratio E71 of the frequency difference D71 to the frequency bandwidth W11 is within a preset ratio range K71, wherein the preset ratio range K71 is from 5% (i.e. 5 percent) to 20% (i.e. 20 percent). For example, preferably, the first cutoff frequency F11 is equal to 4.75 GHz. The cutoff frequency F12 is equal to 5.39 GHz. The second cutoff frequency F21 is equal to 4.66 GHz. The ratio E71 is equal to 14.6%. The ratio E11 is equal to one selected from the plurality of ratios E51, E61 and E71.

While the invention has been described in terms of what is presently considered to be the most practical and preferred embodiments, it is to be understood that the disclosure need not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A signal filter comprising:
a substrate;
a notch filter disposed on the substrate and configured to perform a band-rejection filtering operation according to a band-rejection filtering property;
a wideband filter disposed on the substrate and configured to perform a wideband filtering operation according to a wideband filtering property; and
an impedance matching element, wherein:
the substrate supports the notch filter and the wideband filter, and includes a coupling circuit wherein the wideband filter is a bandpass filter;
the impedance matching element is electrically coupled to the notch filter and the wideband filter through the coupling circuit;
the notch filter is electrically coupled to the wideband filter through the coupling circuit;
the band-rejection filtering property includes a first cutoff frequency and a first frequency bandwidth;
the wideband filtering property includes a second cutoff frequency;
the first and the second cutoff frequencies have a frequency difference therebetween; and
a ratio of the frequency difference to the first frequency bandwidth is within a preset ratio range being from 2.5% to 20%.

2. The signal filter according to claim 1, wherein:
the substrate is an integrated multilayer substrate;
the notch filter disposed on the integrated multilayer substrate; and
the wideband filter disposed in the integrated multilayer substrate.

3. The signal filter according to claim 2, wherein:
the coupling circuit includes a first outer connection terminal, a second outer connection terminal and an inner connection terminal;
the notch filter and the impedance matching element are electrically connected to the first and the second outer connection terminals respectively; and
the wideband filter is electrically connected to the inner connection terminal.

4. The signal filter according to claim 1, wherein:
the substrate is a printed circuit board;
the coupling circuit is a printed circuit; and
each of the notch filter and the wideband filter is disposed on the printed circuit board.

5. The signal filter according to claim 4, wherein:
the signal filter further comprises an impedance matching unit;
the printed circuit includes a first connection terminal, a second connection terminal and a third connection terminal;
the notch filter, the impedance matching unit and the wideband filter are electrically connected to the first, the second and the third connection terminals respectively; and
the impedance matching unit includes at least one impedance matching element, and is electrically coupled to the notch filter and the wideband filter through the printed circuit.

6. The signal filter according to claim 1, wherein:
the band-rejection filtering property includes a relatively high quality factor and a relatively low coupling coefficient;
the relatively high quality factor ranges from 950 to 3500; and
a shape factor associated with the first frequency bandwidth is within a preset shape factor range being from 0.4 to 0.8.

7. The signal filter according to claim 1, wherein:
the wideband filter is one selected from a group consisting of a high-pass filter, a band-pass filter and a low-pass filter;
under a condition that the wideband filter is the band-pass filter, the wideband filtering property further includes a second frequency bandwidth and a center frequency; and
a ratio of the second frequency bandwidth to the center frequency ranges from 5% to 50%.

8. The signal filter according to claim 7, wherein:
the wideband filter is manufactured by using one of a multilayer ceramic capacitor (MLCC) process and a low-temperature co-fired ceramic (LTCC) process in order to meet the wideband filtering property;
the wideband filtering property includes a relatively low quality factor and a relatively high coupling coefficient;
a coupling ratio associated with the relatively high coupling coefficient ranges from 30% to 60%.

9. A signal filter comprising:
a first filtering unit configured to perform a first specific filtering operation according to a first specific filtering property;
a second filtering unit configured to perform a second specific filtering operation according to a second specific filtering property including a relatively low quality factor and a relatively high coupling coefficient; and
a substrate supporting the first and the second filtering units, and including a coupling circuit, wherein the first filtering unit is electrically coupled to the second filtering unit through the coupling circuit, wherein:
the first filter unit is a notch filter, and the second filter unit is a wideband filter
the signal filter further comprises an impedance matching element;
the substrate supports the impedance matching element;
the impedance matching element is electrically coupled to the notch filter and the wideband filter through the coupling circuit; and
the wideband filter is a bandpass filter.

10. The signal filter according to claim 9, wherein:
the first filtering unit, the first specific filtering property and the first specific filtering operation are a notch filter, a band-rejection filtering property and a band-rejection filtering operation respectively;
the first specific filtering property further includes a first cutoff frequency and a frequency bandwidth;
the second filtering unit, the second specific filtering property and the second specific filtering operation are a wideband filter, a wideband filtering property and a wideband filtering operation respectively;
the second specific filtering property further includes a second cutoff frequency;
the first and the second cutoff frequencies have a frequency difference therebetween; and
a ratio of the frequency difference to the frequency bandwidth is within a preset ratio range being from 2.5% to 20%.

11. The signal filter according to claim 9, wherein:
the signal filter is disposed in one of a first structure state and a second structure state.

12. The signal filter according to claim 11, wherein under a condition that the signal filter is in the first structure state:
the substrate is an integrated multilayer substrate;
each of the impedance matching element and the notch filter is disposed on the integrated multilayer substrate; and
the wideband filter is disposed in the integrated multilayer substrate.

13. The signal filter according to claim 11, wherein under a condition that the signal filter is in the second structure state:
the substrate is a printed circuit board;
the coupling circuit is a printed circuit; and
each of the impedance matching element, the notch filter and the wideband filter is disposed on the printed circuit board.

14. The signal filter according to claim 9, wherein:
the first specific filtering property further includes a frequency bandwidth;
the first specific filtering property includes a relatively high quality factor and a relatively low coupling coefficient;
the relatively high quality factor ranges from 950 to 3500;
the second specific filtering property includes a relatively low quality factor and a relatively high coupling coefficient;
a coupling ratio associated with the relatively high coupling coefficient ranges from 30% to 60%; and
a shape factor associated with the frequency bandwidth is within a preset shape factor range being from 0.4 to 0.8.

15. A signal filter comprising:
a notch filter configured to perform a band-rejection filtering operation according to a band-rejection filtering property; and
a wideband filter coupled to the notch filter, and configured to perform a wideband filtering operation according to a wideband filtering property, wherein:
the band-rejection filtering property includes a first cutoff frequency and a frequency bandwidth;
the wideband filtering property includes a second cutoff frequency, a relatively low quality factor and a relatively high coupling coefficient;
the first and the second cutoff frequencies have a frequency difference therebetween;
a ratio of the frequency difference to the frequency bandwidth is within a preset ratio range being from 2.5% to 20%;
the signal filter further comprises a coupling substrate and an impedance matching element;
the coupling substrate supports the notch filter, the wideband filter and the impedance matching element, and includes a coupling circuit;
the notch filter is electrically coupled to the wideband filter through the coupling circuit;
the impedance matching element is electrically coupled to the notch filter and the wideband filter through the coupling circuit; and
the wideband filter is a bandpass filter.

16. The signal filter according to claim 15, wherein:
the signal filter is in one of a first structure state and a second structure state.

17. The signal filter according to claim 16, wherein under a condition that the signal filter is in the first structure state:
the coupling substrate is an integrated multilayer substrate;
each of the impedance matching element and the notch filter is disposed on the integrated multilayer substrate; and
the wideband filter is disposed into the integrated multilayer substrate.

18. The signal filter according to claim 16, wherein under a condition that the signal filter is in the second structure state:
the coupling substrate is a printed circuit board;
the coupling circuit is a printed circuit; and
each of the impedance matching element, the notch filter and the wideband filter is disposed on the printed circuit board.

19. The signal filter according to claim 15, wherein:
the band-rejection filtering property further includes a relatively high quality factor and a relatively low coupling coefficient, the relatively high quality factor ranges from 950 to 3500;
the wideband filtering property further includes a relatively low quality factor and a relatively high coupling coefficient, and
a coupling ratio associated with the relatively high coupling coefficient ranges from 30% to 60%.

20. The signal filter according to claim 15, wherein a shape factor associated with the frequency bandwidth is within a preset shape factor range being from 0.4 to 0.8.

* * * * *